(12) United States Patent
Song et al.

(10) Patent No.: US 9,859,210 B2
(45) Date of Patent: Jan. 2, 2018

(54) INTEGRATED CIRCUITS HAVING REDUCED DIMENSIONS BETWEEN COMPONENTS

(71) Applicant: QUALCOMM Incorporated, San Diego, CA (US)

(72) Inventors: Stanley Seungchul Song, San Diego, CA (US); Choh Fei Yeap, San Diego, CA (US); Da Yang, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 14/744,912

(22) Filed: Jun. 19, 2015

(65) Prior Publication Data

US 2016/0372414 A1    Dec. 22, 2016

(51) Int. Cl.
*H01L 23/528*  (2006.01)
*H01L 21/8234* (2006.01)
(Continued)

(52) U.S. Cl.
CPC .... *H01L 23/528* (2013.01); *H01L 21/823431* (2013.01); *H01L 21/823437* (2013.01);
(Continued)

(58) Field of Classification Search
CPC ........... H01L 21/02532; H01L 21/2652; H01L 21/823412; H01L 21/22; H01L 21/225;
(Continued)

(56) References Cited

U.S. PATENT DOCUMENTS 7,492,013 B2    2/2009  Correale, Jr. et al.
8,863,063 B2   10/2014  Becker et al.
(Continued)

FOREIGN PATENT DOCUMENTS

EP    1065721 A2    1/2001
EP    2988330 A1    2/2016
(Continued)

OTHER PUBLICATIONS

Jhaveri T., et al., "Co-Optimization of Circuits, Layout and Lithography for Predictive Technology Scaling Beyond Gratings," IEEE Transactions on Computer-Aided Design of Integrated Circuits and Systems, Apr. 2010, vol. 29 (4), pp. 509-527.
(Continued)

*Primary Examiner* — Natalia Gondarenko
(74) *Attorney, Agent, or Firm* — Qualcomm Incorporated—Toler

(57) ABSTRACT

In a particular aspect, an integrated circuit includes a first transistor including a first source region and a first drain region. The integrated circuit includes a second transistor including a second source region and a second drain region. The integrated circuit includes a first gate structure coupled to the first transistor and to the second transistor. The first gate structure is included in a first layer. The integrated circuit further includes a first metal line coupled to the first source region and to the second drain region. The first metal line has a two-dimensional routing arrangement and is included in a second layer that is distinct from the first layer.

16 Claims, 9 Drawing Sheets

(51) Int. Cl.

| | |
|---|---|
| *H01L 27/06* | (2006.01) |
| *H01L 29/66* | (2006.01) |
| *H01L 21/8238* | (2006.01) |
| *H01L 21/84* | (2006.01) |
| *H01L 27/02* | (2006.01) |
| *H01L 27/092* | (2006.01) |
| *H01L 27/12* | (2006.01) |
| *H01L 23/522* | (2006.01) |
| *H01L 27/088* | (2006.01) |
| *H01L 29/78* | (2006.01) |
| *H01L 23/48* | (2006.01) |
| *H01L 23/525* | (2006.01) |

(52) U.S. Cl.
CPC ............... *H01L 21/823475* (2013.01); *H01L 21/823821* (2013.01); *H01L 21/845* (2013.01); *H01L 23/5226* (2013.01); *H01L 27/0207* (2013.01); *H01L 27/0886* (2013.01); *H01L 27/0924* (2013.01); *H01L 27/1211* (2013.01)

(58) Field of Classification Search
CPC ............ H01L 21/2256; H01L 21/2253; H01L 21/28176; H01L 21/2818; H01L 21/823475; H01L 21/84; H01L 21/32133; H01L 21/76224; H01L 21/823807; H01L 21/823481; H01L 21/8238; H01L 21/823431; H01L 21/823437; H01L 21/823821; H01L 21/823814; H01L 29/0649; H01L 29/0878; H01L 29/66; H01L 29/66636; H01L 29/6659; H01L 29/66795; H01L 29/66477; H01L 29/78618; H01L 29/78; H01L 29/785; H01L 27/0924; H01L 27/092; H01L 27/0886; H01L 23/528; H01L 23/5226; H01L 27/085–27/098; H01L 27/11; H01L 27/116; H01L 27/12–27/1211; H01L 27/1214–27/1296; H01L 23/481; H01L 23/5384; H01L 21/823871; H01L 21/8234; H01L 27/0207

USPC ................. 257/401, 347, 369, 329; 438/478
See application file for complete search history.

(56) References Cited

U.S. PATENT DOCUMENTS

| | | | |
|---|---|---|---|
| 2005/0044522 A1 | 2/2005 | Maeda | |
| 2009/0212838 A1 | 8/2009 | Kim et al. | |
| 2010/0037191 A1 | 2/2010 | Kosuge | |
| 2011/0140203 A1 | 6/2011 | Hou et al. | |
| 2012/0313256 A1 | 12/2012 | Lu et al. | |
| 2013/0020644 A1* | 1/2013 | Horita | G11C 11/412 257/351 |
| 2013/0126978 A1* | 5/2013 | Becker | H01L 27/092 257/369 |
| 2013/0207199 A1* | 8/2013 | Becker | H01L 27/092 257/369 |
| 2014/0042641 A1 | 2/2014 | Rashed et al. | |
| 2014/0197463 A1* | 7/2014 | Gan | H01L 27/11807 257/204 |
| 2014/0231916 A1* | 8/2014 | Giraud | H01L 29/42392 257/347 |
| 2014/0252543 A1 | 9/2014 | Li et al. | |
| 2015/0014780 A1* | 1/2015 | Kim | H01L 27/0924 257/369 |
| 2015/0194427 A1* | 7/2015 | Sengupta | H01L 27/0886 257/401 |
| 2016/0197085 A1* | 7/2016 | Ju | H01L 27/1104 257/369 |

FOREIGN PATENT DOCUMENTS

| | | |
|---|---|---|
| JP | 2003229575 A | 8/2003 |
| JP | 2014103254 A | 6/2014 |
| WO | 2006100795 A1 | 9/2006 |
| WO | 2015029280 A1 | 3/2015 |

OTHER PUBLICATIONS

International Search Report and Written Opinion—PCT/US2016/037875—ISA/EPO—Oct. 31, 2016.
Partial International Search Report—PCT/US2016/037875—ISA/EPO—Sep. 9, 2016.

* cited by examiner

INTEGRATED CIRCUITS HAVING REDUCED DIMENSIONS BETWEEN COMPONENTS

I. FIELD

The present disclosure is generally related to integrated circuits that have reduced dimensions between components of the integrated circuits.

II. DESCRIPTION OF RELATED ART

Advances in technology have resulted in smaller and more powerful computing devices. For example, a variety of portable personal computing devices, including wireless telephones such as mobile and smart phones, tablets and laptop computers are small, lightweight, and easily carried by users. These devices can communicate voice and data packets over wireless networks. Further, many such devices incorporate additional functionality such as a digital still camera, a digital video camera, a digital recorder, and an audio file player. Also, such devices can process executable instructions, including software applications, such as a web browser application, that can be used to access the Internet. As such, these devices can include significant computing and networking capabilities.

An integrated circuit formed using conventional 28 nanometer (nm) process node technology includes planar transistors. Additionally, an integrated circuit formed using the conventional 28 nm process node technology has a contacted poly pitch (CPP) (e.g., a pitch between two adjacent gate structures of two adjacent transistors of the integrated circuit) that is equal to 130 nm and a "metal pitch" in the "metal-1" layer (e.g., a pitch between two adjacent metal wires in the metal-1 layer) that is equal to 90 nm. An integrated circuit formed using conventional 16 nm or 14 nm process node technology may include fin field-effect transistors (FinFETs). Additionally, the integrated circuit formed using the conventional 16 nm or 14 nm process node technology may have a CPP that is equal to 90 nm and a metal pitch in the metal-1 layer that is equal to 64 nm. In order to form an integrated circuit using the conventional 16 nm or 14 nm process node technology, a double patterning process is typically used to form each metal layer of the integrated circuit, which may significantly increase the cost of the integrated circuit fabrication process.

III. SUMMARY

The present disclosure provides integrated circuits having reduced measurements between components of the integrated circuits as compared to integrated circuits formed using conventional 28 nanometer (nm) process node technology. Additionally, the integrated circuits are formed without performing double patterning to form each metal layer, as compared to integrated circuits formed using a double patterning process to form each metal layer in accordance with conventional 16 nm or 14 nm process node technology.

For example, a first integrated circuit includes a first transistor and a second transistor having a common gate structure (e.g., a first gate structure coupled to the first transistor and to the second transistor). As a non-limiting example, the first integrated circuit may be included in a static random access memory (SRAM) device, and the first transistor and the second transistor may form one of a pair of cross-coupled inverters of a memory cell of the SRAM device. The first transistor and the second transistor may be fin field-effect transistor (FinFET) devices. A contacted poly pitch (CPP) for the first integrated circuit may be reduced as compared to a minimum CPP allowed by design rules/constraints of the conventional 28 nm process node technology. For example, a pitch between the first gate structure and an adjacent gate structure may be greater than or equal to approximately 80 nm and less than approximately 100 nm, as compared to a CPP of 130 nm (or greater) in the conventional 28 nm process node technology. In some aspects, the first gate structure may be formed using a high-k/metal gate (HK/MG) last process. An HK/MG last process refers to a process in which a metal gate is deposited after a high temperature activation anneal performed during fabrication, instead of depositing the metal gate before the high temperature activation anneal (e.g., a HK/MG first process). Additionally, connections in a metal-1 layer of the integrated circuit may use metal lines having a two-dimensional routing arrangement. For example, a source region of the first transistor and a drain region of the second transistor may be coupled together by a metal line in the metal-1 layer having a two-dimensional routing arrangement (e.g., the metal line may be routed in a first direction substantially parallel to a routing direction of the first gate structure and in a second direction substantially perpendicular to the routing direction of the first gate structure). Metal lines in the metal-1 layer may have a metal pitch of approximately 90 nm and may be formed using a single patterning process.

As another example, a second integrated circuit includes a first transistor and a second transistor having a common gate structure (e.g., a first gate structure coupled to the first transistor and to the second transistor). The first transistor and the second transistor may be FinFET devices. A contacted poly pitch (CPP) for the first integrated circuit may be "relaxed" (e.g., increased) as compared to a minimum CPP allowed by design rules/constraints of the conventional 28 nm process node technology so that other metal connections may be included in the same layer (e.g., a "metal-0" layer) as the first gate structure. For example, a pitch between the first gate structure and an adjacent gate structure may be between approximately 100 nm and approximately 120 nm, and a contact structure may be coupled to a source region of the first transistor and to a drain region of the second transistor. Including both the first gate structure and the contact structure in the metal-0 layer may be referred to as having "MD passing MP." In some aspects, the first gate structure may be formed using a high-k/metal gate (HK/MG) last process. Metal lines in the metal-1 layer may be routed in a single direction that is perpendicular to a routing direction of the first gate structure and may have a metal pitch of less than approximately 64 nm. The metal lines in the metal-1 layer may be formed using a double patterning process. Metal lines in higher metal layers (e.g., metal-2 and higher) may be formed using a single patterning process, thereby reducing cost as compared to using a double patterning process to form each metal layer.

In a particular aspect, an integrated circuit includes a first transistor including a first source region and a first drain region and a second transistor including a second source region and a second drain region. The integrated circuit includes a first gate structure coupled to the first transistor and to the second transistor. The first gate structure is included in a first layer. The integrated circuit further includes a first metal line coupled to the first source region and to the second drain region. The first metal line has a two-dimensional routing arrangement and is included in a second layer that is distinct from the first layer.

In a particular aspect, an integrated circuit includes a first transistor including a first source region and a first drain region and a second transistor including a second source region and a second drain region. The integrated circuit includes a first gate structure coupled to the first transistor and to the second transistor. The integrated circuit includes a first contact structure coupled to the first gate structure. The integrated circuit includes a second contact structure coupled to the first source region and to the second drain region. The first gate structure and the second contact structure are included in a first layer. The integrated circuit includes a first metal line coupled to the first contact structure. The integrated circuit further includes a second metal line coupled to the second contact structure. The first metal line and the second metal line are included in a second layer that is distinct from the first layer. The first gate structure is oriented along an axis in a first direction. The first metal line and the second metal line are routed in a second direction that is substantially perpendicular to the first direction.

In a particular aspect, a method of fabricating an integrated circuit includes forming a first gate structure in a first layer above an active area layer (e.g., a layer including source regions and/or drain regions) of a first transistor and a second transistor. The first transistor includes a first source region and a first drain region, and the second transistor includes a second source region and a second drain region. The method further includes forming, in a second layer that is distinct from the first layer, a first metal line coupled to the first source region and to the second drain region. The first metal line has a two-dimensional routing arrangement.

In another particular aspect, a method of fabricating an integrated circuit includes forming a first gate structure in a first layer above an active area layer (e.g., a layer including source regions and/or drain regions) of a first transistor and a second transistor. The first transistor includes a first source region and a first drain region, and the second transistor includes a second source region and a second drain region. The method includes forming, in the first layer, a first contact structure coupled to the first gate structure. The method includes forming, in the first layer, a second contact structure coupled to the first source region and to the second drain region. The method includes forming, in a second layer that is distinct from the first layer, a first metal line coupled to the first contact structure. The first gate structure is oriented along an axis in a first direction. The first metal line is routed in a second direction that is substantially perpendicular to the first direction. The method further includes forming, in the second layer, a second metal line coupled to the second contact structure and routed in the second direction.

One particular advantage provided by at least one of the disclosed aspects is integrated circuits that have reduced measurements between components of the integrated circuits as compared to integrated circuits formed using the conventional 28 nm process node technology. For example, a first integrated circuit described herein has a CPP that is greater than or equal to approximately 80 nm and less than approximately 100 nm, and a second integrated circuit described herein has a metal pitch (in the metal one layer) that is less than approximately 64 nm. The reduced measurements of the first integrated circuit and the second integrated circuit enable more integrated circuit structures to be formed on a single semiconductor die, thereby increasing density, as compared to integrated circuits formed using the conventional 28 nm process node technology. Additionally, the increased density is achieved without incurring the cost of performing a double patterning process on each metal layer, such as in the conventional 16 nm or 14 nm process node technology.

Other aspects, advantages, and features of the present disclosure will become apparent after review of the entire application, including the following sections: Brief Description of the Drawings, Detailed Description, and the Claims.

IV. BRIEF DESCRIPTION OF THE DRAWINGS

Figure 1:
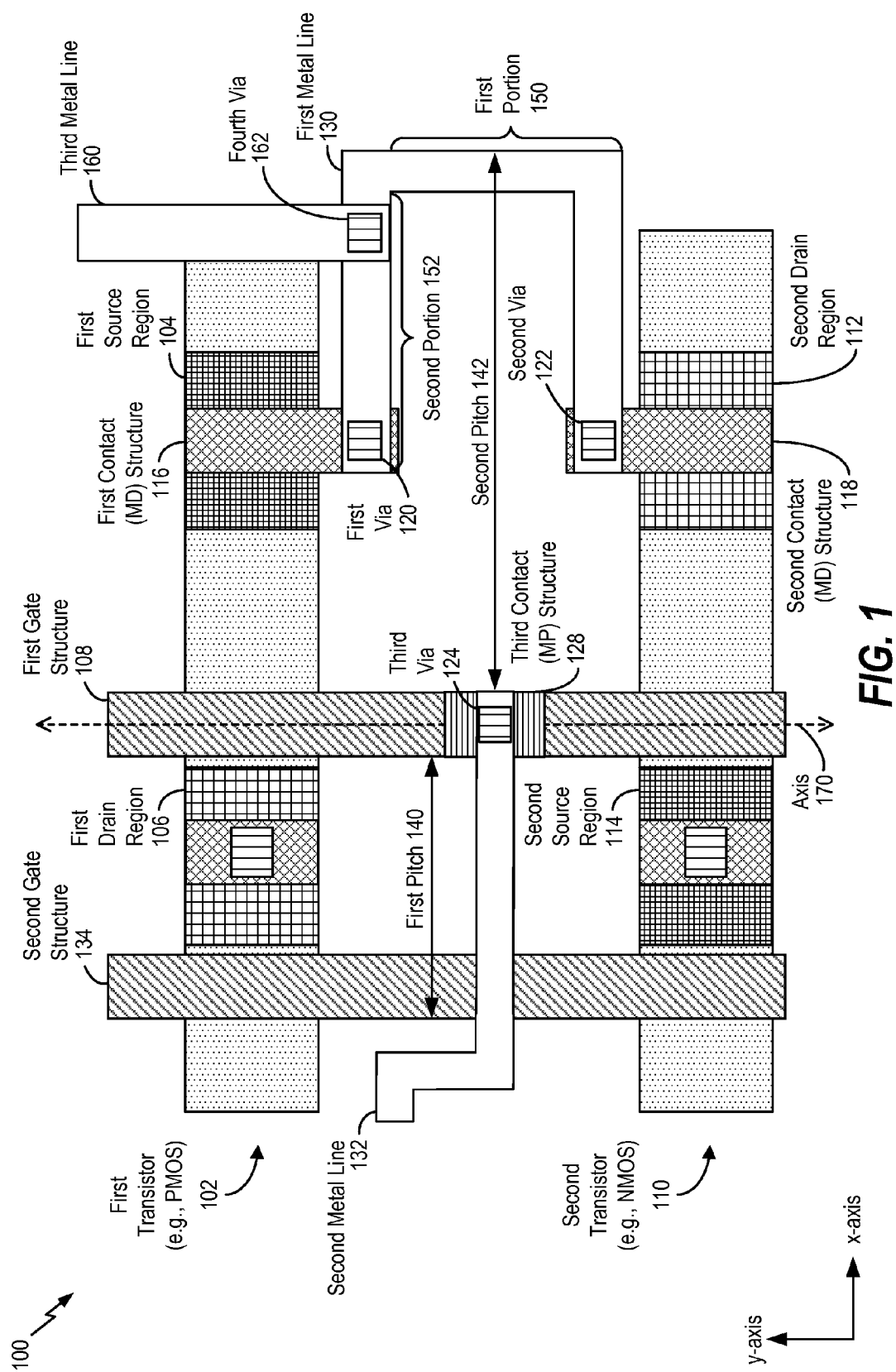
FIG. 1 is a diagram of an integrated circuit having a reduced contacted poly pitch and including metal line(s) in a metal-1 layer having a two-dimensional routing arrangement.
Figure 2:
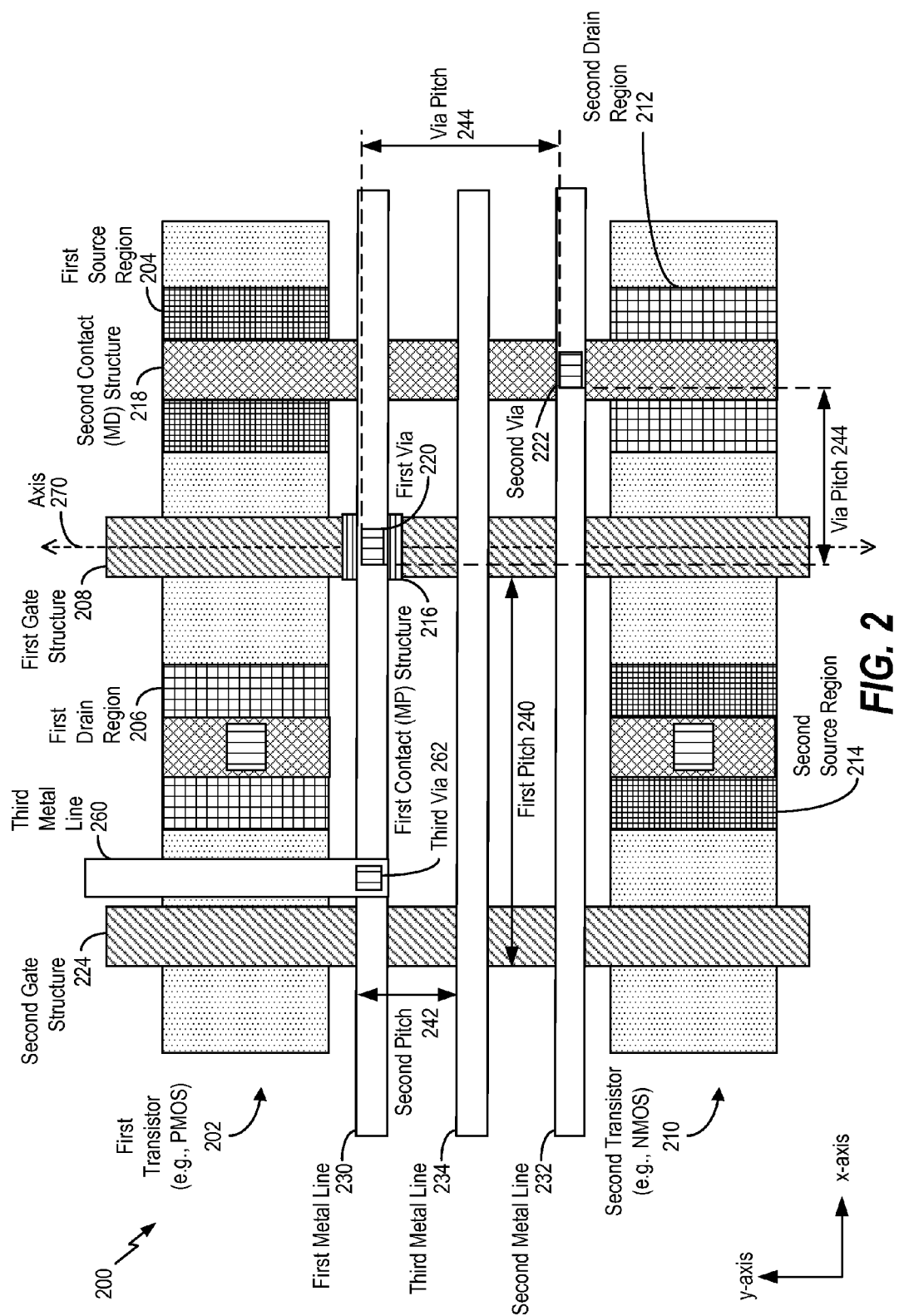
FIG. 2 is a diagram of an integrated circuit having a gate structure and a contact structure in a metal-0 layer and a metal-1 layer having a reduced metal-1 pitch and a one-dimensional routing arrangement.
Figure 8:
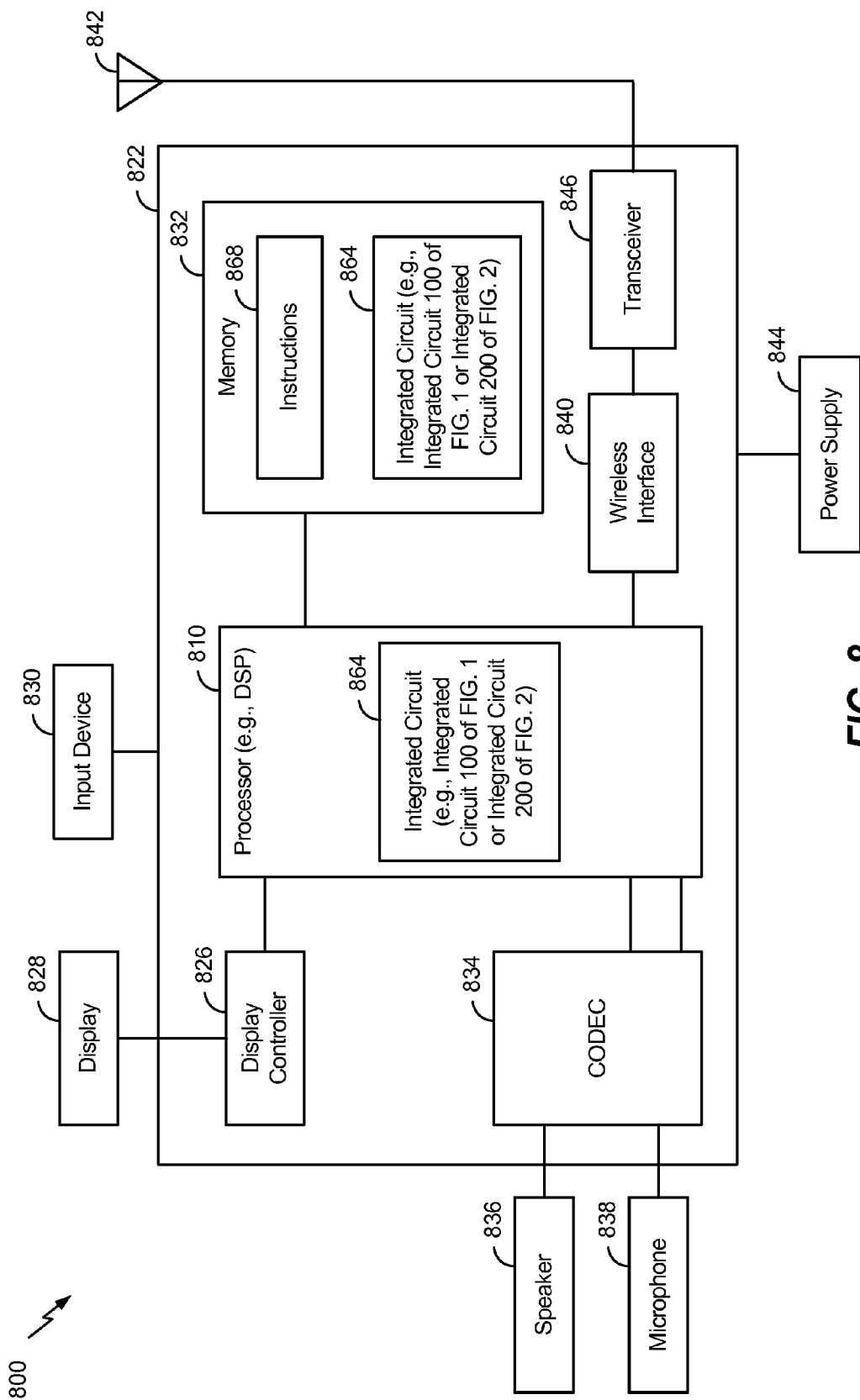
Figure 9:
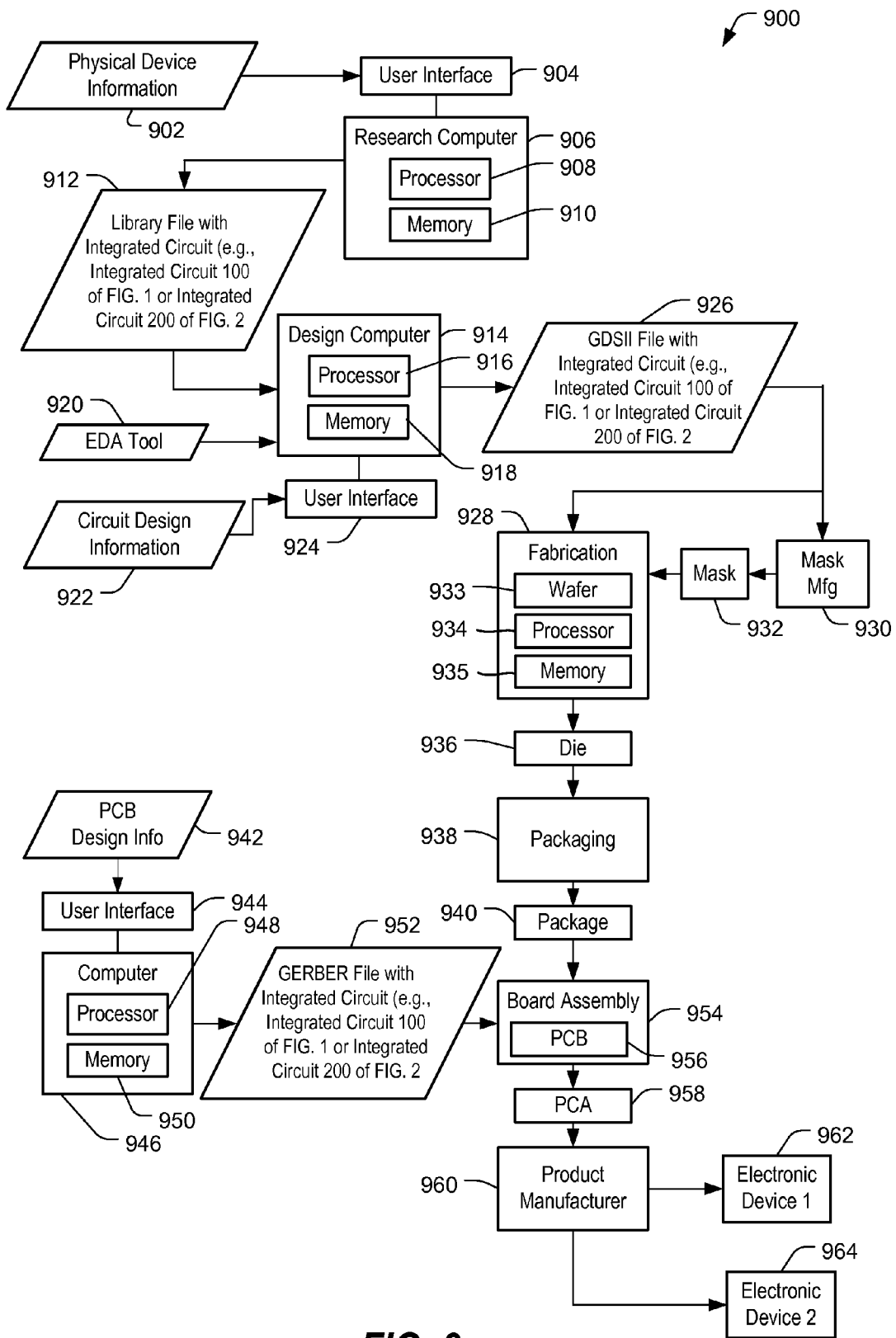

FIG. 8 is a block diagram of a device including the integrated circuit 100 of FIG. 1 or the integrated circuit 200 of FIG. 2; and FIG. 9 is a data flow diagram of an illustrative aspect of a manufacturing process to fabricate a device including the integrated circuit 100 of FIG. 1 or the integrated circuit 200 of FIG. 2.

V. DETAILED DESCRIPTION

Particular aspects of the present disclosure are described below with reference to the drawings. In the description, common features are designated by common reference numbers throughout the drawings.

The present disclosure describes integrated circuits and methods of forming the integrated circuits, having reduced measurements between components as compared to an integrated circuit formed using conventional 28 nanometer (nm) process node technology. For example, a first integrated circuit may have a reduced contacted poly pitch (CPP) as compared to an integrated circuit formed using the conventional 28 nm process node technology. The first integrated circuit may also include metal lines in a "metal-1" layer (also referred to as a "M1" layer) having a two-dimensional routing arrangement. As another example, a second integrated circuit may have a reduced CPP and a reduced metal-1 pitch, as compared to an integrated circuit formed using the conventional 28 nm process node technology. The second integrated circuit may include, in a same layer as a gate structure, a contact structure that couples a first transistor to a second transistor. Additionally, the integrated circuits may be formed at a reduced cost as compared to an integrated circuit formed using conventional 16 nm or 14 nm process node technology. For example, the first integrated circuit may be formed by performing a single patterning process to form each metal layer (as compared to performing a double patterning process to form each metal layer in the conventional 16 nm or 14 nm process node technology). The second integrated circuit may be formed by performing a double patterning process to form the metal-1 layer and a single patterning process to form each higher metal layer (as compared to performing a double patterning process to form each metal layer in the conventional 16 nm or 14 nm process node technology).

Referring to FIG. 1, an integrated circuit 100 having a reduced contacted poly pitch and including metal line(s) in a metal-1 layer having a two-dimensional routing arrangement is depicted. The integrated circuit 100 includes a first transistor 102 and a second transistor 110 formed in a substrate. The first transistor 102 may include a first source region 104 and a first drain region 106, and the second transistor 110 may include a second source region 114 and a second drain region 112. The first source region 104, the first drain region 106, the second source region 114, and the second drain region 112 may be included in an active area layer of the integrated circuit 100. The active area layer may include or correspond to a substrate. In a particular implementation, the first transistor 102 is a PMOS transistor and the second transistor 110 is an NMOS transistor. In other implementations, the first transistor 102 may be an NMOS transistor and/or the second transistor 110 may be a PMOS transistor. The first transistor 102 and the second transistor 110 include fin field-effect transistors (FinFETs) and have increased drive strength as compared to planar transistors having the same size.

The integrated circuit 100 includes a first gate structure 108 coupled to the first transistor 102 and the second transistor 110 (e.g., the first gate structure 108 may be a common gate structure of the first transistor 102 and the second transistor 110). The first gate structure 108 may be formed above the active area layer of the integrated circuit 100. In a particular implementation, the first gate structure 108 may include a gate electrode. The first gate structure 108 may include a conductive gate material. For example, the first gate structure 108 may include polysilicon, tantalum nitride (TaN), and/or titanium nitride (TiN), as illustrative, non-limiting examples. The integrated circuit 100 may also include a second gate structure 134 that is adjacent to the first gate structure 108. The second gate structure 134 may be a dummy gate structure or may be coupled to other transistors (not illustrated).

In a particular implementation, the first gate structure 108 (and the second gate structure 134) may be formed using a high-k/metal gate (HK/MG) last process (also referred to as a "gate last" process). During an HK/MG last process, a metal gate (e.g., the first gate structure 108 and/or the second gate structure 134) may be deposited after a high temperature activation anneal is performed during fabrication of the integrated circuit 100, instead of depositing the metal gate before performing the high temperature activation anneal, as in a HK/MG first process (also referred to as a "gate first" process). The HK/MG last process may be performed during a middle-of-line (MOL) fabrication stage of fabricating the integrated circuit 100. Forming the first gate structure 108 using the HK/MG last process may achieve a target electrical thickness at inversion state ("$T_{inv}$") value and may enhance strain in the first gate structure 108 as compared to forming the first gate structure 108 using a different process, such as a HK/MG first process or a HK first, MG last process. In a particular implementation, the HK/MG last process may include or correspond to a silicide-last process.

The integrated circuit 100 may include a first contact structure 116 coupled to the first source region 104 and a second contact structure 118 coupled to the second drain region 112. The first contact structure 116 and the second contact structure 118 may include metal. A third contact structure 128 may be coupled to the first gate structure 108. In some implementations, the third contact structure 128 includes metal. For example, the contact structures 116, 118, and 128 may include copper (Cu), aluminum (Al), tungsten (W), and/or tantalum (Ta), as illustrative, non-limiting examples. In other implementations, the third contact structure 128 includes the same material as the first gate structure 108. The first contact structure 116 and the second contact structure 118 may be referred to as "MD" structures (e.g., source/drain contacts), and the third contact structure 128 may be referred to as a "MP" structure (e.g., a gate contact). The first contact structure 116, the second contact structure 118, the third contact structure 128, and the first gate structure 108 may be included in a first layer of the integrated circuit 100. For example, the first layer may include or correspond to a "metal-0" (or "M0") layer. Additionally, the integrated circuit 100 may include a fourth contact structure coupled to the first drain region 106 and a fifth contact structure coupled to the second source region 114.

The integrated circuit 100 also includes a first metal line 130 coupled to the first source region 104 and to the second drain region 112. For example, the first metal line 130 may be coupled to the first source region 104 by the first contact structure 116 and coupled to the second drain region 112 by the second contact structure 118. To illustrate, a first via structure 120 may couple the first metal line 130 to the first contact structure 116, and a second via structure 122 may couple the first metal line 130 to the second contact structure 118. The integrated circuit 100 may also include a second metal line 132 that is coupled by a third via structure 124 to the third contact structure 128. The metal lines 130 and 132 may include one or more conductive materials. For example, the metal lines 130 and 132 may include copper (Cu), aluminum (Al), and/or tantalum (Ta), as illustrative, non-limiting examples. The first metal line 130 and the second metal line 132 may be included in a second layer that is distinct from the first layer. For example, the second layer may include or correspond to a "metal-1" (or "M1") layer. The first via structure 120, the second via structure 122, and the third via structure 124 may be included in a first via layer (e.g., a "via-0" or "V0" layer) that is between the metal-1 layer and the metal-0 layer.

The first metal line 130 may have a two-dimensional routing arrangement. In FIG. 1, the first gate structure 108 is oriented along an axis 170 in a first direction. The first direction is perpendicular to an x-axis illustrated in FIG. 1 and parallel to a y-axis illustrated in FIG. 1. For example, a first portion 150 of the first metal line 130 may be routed in the first direction (e.g., a vertical direction of the y-axis in FIG. 1 that is substantially parallel to the axis 170). A second portion 152 of the first metal line 130 may be routed in the second direction (e.g., a horizontal direction of the x-axis in FIG. 1 that is substantially perpendicular to the axis 170). If the integrated circuit 100 has a different orientation than illustrated in FIG. 1, the first direction (and the y axis) and the second direction (and the x-axis) do not extend in the vertical direction and the horizontal direction, respectively. Additional portions of the first metal line 130 may be routed in the first direction or the second direction. The second metal line 132 may also have a two dimensional routing direction. For example, in FIG. 1, a first portion of the second metal line 132 may be routed in the second direction (e.g., the horizontal direction), and a second portion of the second metal line 132 may be routed in the first direction (e.g., the vertical direction). Metal lines in the metal-1 layer having a two-dimensional routing arrangement are further illustrated with reference to FIG. 3.

The metal lines (e.g., the first metal line 130 and the second metal line 132) of the metal-1 layer may be formed using a single patterning process. Metal lines of higher metal layers may also be formed using a single patterning process. For example, the integrated circuit 100 may include a third metal line 160 in a third layer. The third layer may include or correspond to a "metal-2" (or "M2") layer. The third metal line 160 may be coupled by a fourth via structure 162 to the first metal line 130. The fourth via structure 162 may be included in a second via layer (e.g., a "via-1" layer or "V1" layer). Although a single metal line (e.g., the third metal line 160) is illustrated, the third layer (e.g., the metal-2 layer) may include multiple metal lines that are each formed using a single patterning process. Additional higher metal layers (e.g., a "metal-3" layer, a "metal-4" layer, etc.) may also include multiple metal lines formed using a single patterning process. Additionally, via structures (and metal lines in the metal-1 layer and the higher metal layers) may connect the fourth contact structure to a first power supply (e.g., Vdd) and may connect the fifth contact structure to a second power supply (e.g., Vss) or to ground. The additional connections are not illustrated for convenience.

A first pitch 140 between the first gate structure 108 and the second gate structure 134 may be less than a second pitch 142 between the first metal line 130 and the second metal line 132. The first pitch 140 may be a contacted poly pitch (CPP) and the second pitch 142 may be a "metal pitch" (e.g., a "metal-1 pitch"). The first pitch 140 may be a minimum CPP allowed by a design rule or a design constraint, and the second pitch 142 may be a minimum metal-1 pitch allowed by a design rule or a design constraint. For example, a design rule or a design constraint may be set such that the minimum CPP is less than the minimum metal-1 pitch. In a particular implementation, the first pitch 140 may be greater than or equal to approximately 80 nm and less than approximately 100 nm, and the second pitch 142 may be approximately 90 nm. Because the first pitch 140 is less than the second pitch 142, connections of regions located between adjacent gate structures may occur in higher metal layers. To illustrate, the first source region 104 and the second drain region 112 are connected by the second metal line 132 in the second layer (e.g., the metal-1 layer) instead of by a contact structure in the first layer (e.g., the metal-0 layer). Because the first source region 104 and the second drain region 112 are not connected by a contact structure, the integrated circuit 100 may be referred to as having "MD not passing MP." For example, a source/drain contact structure (e.g., an MD structure) may not pass a gate contact (e.g., an MP structure) in the first direction (e.g., the vertical direction of the y-axis in FIG. 1).

The integrated circuit 100 may have reduced dimensions, based on the first pitch 140 and the second pitch 142, as compared to an integrated circuit formed using the conventional 28 nm process node technology. In a particular implementation, the first pitch 140 may be greater than or equal to approximately 80 nm and less than approximately 100 nm, and the second pitch 142 may be approximately 90 nm. In comparison, an integrated circuit formed using the conventional 28 nm process node technology may have a CPP of 130 nm and a metal-1 pitch of 90 nm. Because the first pitch 140 (e.g., the CPP) of the integrated circuit 100 is less than the CPP value of the conventional 28 nm process node technology, the integrated circuit 100 may use less area than an integrated circuit formed using the conventional 28 nm process node technology. Reducing the area usage may increase a number of circuit elements that may be formed on a semiconductor die and may increase device density as compared to the conventional 28 nm process node technology.

Because the metal lines in the metal-1 layer have a two-dimensional routing arrangement instead of a one-dimensional routing arrangement, the metal-1 pitch (e.g., the second pitch 142) may be "relaxed" (e.g., greater) as compared to the CPP (e.g., the first pitch 140). Additionally, because the metal-1 pitch is approximately 90 nm, the lines in the metal-1 layer are spaced sufficiently far apart so that the metal lines in the metal-1 layer may be formed using a single patterning process. Using a single patterning process to form the metal lines of the metal-1 layer reduces costs of fabricating the integrated circuit 100 as compared to using a double patterning process.

In a particular implementation, the integrated circuit 100 may include an inverter (as illustrated in FIG. 1). In this implementation, the integrated circuit 100 may be included in a memory cell of a static random access memory (SRAM) device. For example, the first transistor 102 and the second transistor 110 may form one of a pair of cross-coupled inverters included in a memory cell of the SRAM device. In other implementations, the integrated circuit 100 may include one or more other devices, such as logic gates, adders, etc. Although only two transistors are illustrated in FIG. 1, the integrated circuit 100 may include more than two transistors. The integrated circuit 100 may be included in a cell on a semiconductor die. For example, a semiconductor die may include multiple integrated circuits in multiple cells that are interconnected by the metal layers to form circuit elements. Because the first pitch 140 (e.g., the CPP) is less than the second pitch 142 (e.g., the metal-1 pitch), a cell that includes the integrated circuit 100 may have an asymmetric aspect ratio, as further described with reference to FIG. 5.

During operation, an input voltage may be applied to the first gate structure 108 by application of the input voltage to a contact (not illustrated) that is coupled to the first gate structure 108 via metal lines in the metal layers of the integrated circuit 100 (e.g., via the second metal line 132). The input voltage may enable or disable the first transistor 102 and the second transistor 110. Based on the input voltage, an output voltage may be measured at a second contact (not illustrated) that is coupled to the first metal line 130 via metal lines in higher metal layers of the integrated circuit 100. When the first transistor 102 and the second transistor 110 form an inverter, the input voltage may be inverted to generate the output voltage.

Because the integrated circuit 100 has a reduced CPP (e.g., the first pitch 140) as compared to an integrated circuit formed using conventional 28 nm process node technology, the integrated circuit 100 may use less area as compared to an integrated circuit formed using conventional 28 nm process node technology. For example, an integrated circuit formed using conventional 28 nm process node technology has a CPP of 130 nm or greater and a metal-1 pitch that is greater than 90 nm. Because the first pitch 140 is less than 90 nm, as compared to being 130 nm or greater, the integrated circuit 100 may have a reduced dimension in the direction of the x-axis (e.g., the horizontal direction in FIG.

1). The reduced area (due to the reduced CPP) of the integrated circuit 100 may enable a higher number of integrated circuits 100 to be integrated on a single semiconductor die than a number of integrated circuits formed using the conventional 28 nm process node technology, thus increasing density.

Additionally, because the metal lines (e.g., the first metal line 130 and the second metal line 132) of the second layer (e.g., the metal-1 layer) have a two-dimensional routing arrangement, sufficient routing may be provided while maintaining a metal-1 pitch of approximately 90 nm. Because the metal-1 pitch is approximately 90 nm (or greater), each of the metal layers of the integrated circuit 100 is able to be formed using a single patterning process, as compared to forming each metal layer of an integrated circuit using a double patterning process in accordance with conventional 16 nm or 14 nm process node technology. Forming each metal layer with a single patterning process instead of a double patterning process reduces a cost of fabricating the integrated circuit 100 as compared to fabricating an integrated circuit using conventional 16 nm or 14 nm process node technology. Thus, the integrated circuit 100 may provide improvements to area usage/circuit density as compared to use of conventional 28 nm process node technology, and at lower complexity and cost than use of conventional 16 nm or 14 nm process node technology.

Referring to FIG. 2, an integrated circuit 200 device having a gate structure and a contact structure in a metal-0 layer and a metal-1 layer having a reduced metal-1 pitch and a one-dimensional routing arrangement is depicted. The integrated circuit 200 includes a first transistor 202 and a second transistor 210 formed in a substrate. The first transistor 202 may include a first source region 204 and a first drain region 206, and the second transistor 210 may include a second source region 214 and a second drain region 212. The first source region 204, the first drain region 206, the second source region 214, and the second drain region 212 may be included in an active area layer of the integrated circuit 200. In a particular implementation, the first transistor 202 is a PMOS transistor and the second transistor 210 is an NMOS transistor. In other implementations, the first transistor 202 may be an NMOS transistor and/or the second transistor 210 may be a PMOS transistor. The first transistor 202 and the second transistor 210 include FinFETs and have increased drive strength as compared to planar transistors having the same size.

The integrated circuit 200 includes a first gate structure 208 coupled to the first transistor 202 and the second transistor 210 (e.g., the first gate structure 208 may be a common gate structure of the first transistor 202 and the second transistor 210). The first gate structure 208 may be formed above the active area layer of the integrated circuit 200. The active area layer may include or correspond to a substrate. In a particular implementation, the first gate structure 208 may include a gate electrode. The first gate structure 208 may include a conductive gate material. For example, the first gate structure 208 may include polysilicon, tantalum nitride (TaN), and/or titanium nitride (TiN), as illustrative, non-limiting examples. The integrated circuit 200 may also include a second gate structure 224 that is adjacent to the first gate structure 208. The second gate structure 224 may be a dummy gate structure or may be coupled to other transistors (not illustrated).

In a particular implementation, the first gate structure 208 (and the second gate structure 224) may be formed using a HK/MG last process (also referred to as a "gate last" process). During an HK/MG last process, a metal gate (e.g., the first gate structure 108 and/or the second gate structure 134) may be deposited after a high temperature activation anneal is performed during fabrication of the integrated circuit 100, instead of depositing the metal gate before performing the high temperature activation anneal, as in a HK/MG first process (also referred to as a "gate first" process). The HK/MG last process may be performed during a MOL fabrication stage of fabricating the integrated circuit 200. Forming the first gate structure 208 using the HK/MG last process may achieve a target electrical thickness at inversion state ("$T_{inv}$") value and may enhance strain in the first gate structure 208 as compared to forming the first gate structure 208 (and the second gate structure 224) using a different process, such as a HK/MG first process (also referred to as a "gate first" process) or a HK first, MG last process. In a particular implementation, the HK/MG last process may include or correspond to a silicide-last process.

The integrated circuit 200 includes a first contact structure 216 coupled to the first gate structure 208. The integrated circuit 100 also includes a second contact structure 218 coupled to the first source region 204 and to the second drain region 212. The first contact structure 216 and the second contact structure 218 may include metal. For example, the contact structures 216 and 218 may include copper (Cu), aluminum (Al), tungsten (W), and/or tantalum (Ta), as illustrative, non-limiting examples. The first contact structure 216 may be referred to as a MP structure (e.g., a gate contact) and the second contact structure 218 may be referred to as a MD structure (e.g., a source/drain contact). The first contact structure 216, the second contact structure 218, and the first gate structure 208 may be included in a first layer of the integrated circuit 200. For example, the first layer may include or correspond to a metal-0 (or M0) layer. Because the first source region 204 and the second drain region 212 are coupled together by a connection (e.g., the second contact structure 218) that is in the same layer as the first contact structure 216 (and the first gate structure 208), the integrated circuit 200 may be referred to as having a "MD passing MP" configuration. Additionally, the integrated circuit 200 may include a third contact structure coupled to the first drain region 206 and a fourth contact structure coupled to the second source region 214.

The integrated circuit 200 also includes a first metal line 230 coupled to the first contact structure 216 and a second metal line 232 coupled to the second contact structure 218. The metal lines 230 and 232 may include one or more conductive materials. For example, the metal lines 230 and 232 may include copper (Cu), aluminum (Al), and/or tantalum (Ta), as illustrative, non-limiting examples. The first metal line 230 and the second metal line 232 may be included in a second layer that is distinct from the first layer. For example, the second layer may include or correspond to a metal-1 (or M1) layer. The first metal line 230 and the second metal line 232 may be substantially perpendicular to the first gate structure 208. For example, the first metal line 230 and the second metal line 232 may each have a one-dimensional routing arrangement in a direction that is perpendicular to an axis 270 of the first gate structure 208. In some implementations, the integrated circuit 200 may also include a third metal line 234 disposed between the first metal line 230 and the second metal line 232 (e.g., the third metal line 234 may be an adjacent metal line to the first metal line 230 and the second metal line 232). In FIG. 2, the first gate structure 208 is oriented along the axis 270 in a first direction. The first direction is perpendicular to an x-axis illustrated in FIG. 2 and parallel to a y-axis illustrated in FIG. 2. The metal lines 230-234 may be routed in the second direction (e.g., a horizontal direction of the x-axis). If the integrated circuit 200 has a different orientation than illustrated in FIG. 2, the first direction (and the y axis) and the second direction (and the x-axis) do not extend in the vertical direction and the horizontal direction, respectively. Metal lines in the metal-1 layer having a one-dimensional routing arrangement are further illustrated with reference to FIG. 4.

The first metal line 230 may be coupled by a first via structure 220 to the first contact structure 216 (and to the first gate structure 208). The second metal line 232 may be coupled by a second via structure 222 to the second contact structure 218. The first via structure 220 and the second via structure 222 may be included in a first via layer (e.g., a via-0 or V0 layer) that is between the metal-1 layer and the metal-0 layer. Locations of the first via structure 220 and the second via structure 222 may be set during a design process of the integrated circuit 200 such that a via pitch 244 between the first via structure 220 and the second via structure 222 may not fall below a particular value. For example, the first via pitch 244 may be greater than or equal to approximately 90 nm. Because the via pitch 244 is greater than or equal to 90 nm, the via structures (e.g., the via structures 220-222) of the via-0 layer may be formed using a single patterning process, which reduces a complexity of fabricating the integrated circuit 200 as compared to forming the via structures of the via-0 layer using a double patterning process.

Although the via locations may be set during the design process such that the via pitch 244 is greater than or equal to 90 nm, the metal lines 230-234 may be closer together than 90 nm, as described further herein. Thus, the first via structure 220 and the second via structure 222 may not be connected to adjacent metal lines. Instead of being connected to adjacent metal lines, the via structures of the via-0 layer may be connected to alternating metal lines. For example, if the first via structure 220 is connected to the first metal line 230, the second via structure 222 is connected to the second metal line 232 and is not connected to the third metal line 234 (e.g., a metal line that is adjacent to the first metal line 230). In this manner, via structure placement during the design phase may "jump" adjacent metal lines (e.g., vias may be placed at and/or connected to alternating metal lines, as illustrated in FIG. 2) so that the via pitch 244 is greater than or equal to approximately 90 nm. Causing the via pitch 244 to be greater than or equal to approximately 90 nm may enable the via structures 220 and 222 to be formed using a single patterning process.

The metal lines 230-234 of the metal-1 layer may be formed using a double patterning process. For example, the metal lines 230-234 may be formed using a self-aligned double patterning (SADP) process or a double lithography, double etch (LELE) process. However, metal lines of higher metal layers may be formed using a single patterning process. For example, the integrated circuit 200 may include a fourth metal line 260 in a third layer. The third layer may include or correspond to a metal-2 (or M2) layer. The fourth metal line 260 may be coupled by a third via structure 262 to the first metal line 230. The third via structure 262 may be included in a second via layer (e.g., a via-1 layer or V1 layer). Although a single metal line (e.g., the fourth metal line 260) is illustrated, the third layer (e.g., the metal-2 layer) may include multiple metal lines that are each formed using a single patterning process. Additional higher metal layers (e.g., a metal-3 layer, a metal-4 layer, etc.) may also include multiple metal lines formed using a single patterning process. Additionally, via structures (and metal lines in the metal-1 layer and the higher metal layers) may connect the third contact structure to a first power supply (e.g., Vdd) and may connect the fourth contact structure to a second power supply (e.g., Vss) or to ground. The additional connections are not illustrated for convenience.

A first pitch 240 between the first gate structure 208 and the second gate structure 224 may be greater than a second pitch 242 between the first metal line 230 and the third metal line 234 (e.g., a metal line that is adjacent to the first metal line 230). The first pitch 240 may be a CPP and the second pitch 242 may be a metal pitch (e.g., a metal-1 pitch). The first pitch 240 may be a minimum CPP allowed by a design rule or a design constraint, and the second pitch 242 may be a minimum metal-1 pitch allowed by a design rule or a design constraint. For example, a design rule or a design constraint may be set such that the minimum metal-1 pitch is less than the minimum CPP. In some implementation, the first pitch 240 may be between approximately 100 nm and approximately 120 nm, and the second pitch 242 may be less than approximately 64 nm. In a particular implementation, the second pitch 242 may be within a range between approximately 48 nm and approximately 52 nm Because the first pitch 240 (e.g., the CPP) is "relaxed" (e.g., greater) as compared to the second pitch 242 (e.g., the metal-1 pitch), connections between source and drain regions may be included in the same layer as gate structures. To illustrate, the first source region 204 and the second drain region 212 are connected by the second contact structure 218 that is included with the first contact structure 216 and the first gate structure 208 in the first layer (e.g., the metal-0 layer) instead of by a contact structure in the first layer (e.g., the metal-0 layer). Because the first source region 204 and the second drain region 212 are connected by a contact structure in the metal-0 layer, the integrated circuit 200 may be referred to as having a "MD passing MP" configuration. For example, a source/drain contact structure (e.g., an MD structure) may pass a gate contact (e.g., an MP structure) in the first direction (e.g., the vertical direction of the y-axis in FIG. 2). Increasing the CPP of the integrated circuit 200, as compared to the CPP of the integrated circuit 100 of FIG. 1, may decrease a resistance of the integrated circuit 200, may decrease a capacitance of the integrated circuit 200, and may increase carrier mobility in the integrated circuit 200.

The integrated circuit 200 may have reduced dimensions, based on the first pitch 240 and the second pitch 242, as compared to an integrated circuit formed using the conventional 28 nm process node technology. In a particular implementation, the first pitch 240 may be between approximately 100 nm and approximately 120 nm, and the second pitch 242 may be less than approximately 64 nm, such as within a range between approximately 48 nm and approximately 52 nm. In comparison, an integrated circuit formed using the conventional 28 nm process node technology may have a CPP of 130 nm and a metal-1 pitch of 90 nm. Because the second pitch 142 (e.g., the metal-1 pitch) of the integrated circuit 200 is substantially less than the metal-1 pitch value of the conventional 28 nm process node technology, the integrated circuit 200 may use less area than an integrated circuit formed using the conventional 28 nm process node technology. Reducing the area usage may increase a number of circuit elements that may be formed on a semiconductor die and may increase device density as compared to the conventional 28 nm process node technology.

In a particular implementation, the integrated circuit 200 may include an inverter (as illustrated in FIG. 2). In this implementation, the integrated circuit 200 may be included in a memory cell of a static random access memory (SRAM)

device. For example, the first transistor 202 and the second transistor 210 may form one of a pair of cross-coupled inverters included in a memory cell of the SRAM device. In other implementations, the integrated circuit 200 may include one or more other devices, such as logic gates, adders, etc. Although only two transistors are illustrated in FIG. 2, the integrated circuit 200 may include more than two transistors. The integrated circuit 200 may be included in a cell on a semiconductor die. For example, a semiconductor die may include multiple integrated circuits in multiple cells that are interconnected by the metal layers to form circuit elements. Because the second pitch 142 (e.g., the metal-1 pitch) is less than the first pitch 240 (e.g., the CPP), a cell that includes the integrated circuit 200 may have an asymmetric aspect ratio, as further described with reference to FIG. 5.

During operation, an input voltage may be applied to the first gate structure 208 by application of the input voltage to a contact (not illustrated) that is coupled to the first gate structure 208 via metal lines in the metal layers of the integrated circuit 200 (e.g., via the first metal line 230). The input voltage may enable or disable the first transistor 202 and the second transistor 210. Based on the input voltage, an output voltage may be measured at a second contact (not illustrated) that is coupled to the second metal line 232 via metal lines in higher metal layers of the integrated circuit 200. When the first transistor 202 and the second transistor 210 form an inverter, the input voltage may be inverted to generate the output voltage.

Because the integrated circuit 200 has a reduced metal-1 pitch (e.g., the second pitch 242) as compared to an integrated circuit formed using the conventional 28 nm process node technology, the integrated circuit 200 may use less area as compared to an integrated circuit formed using the conventional 28 nm process node technology. For example, an integrated circuit formed using the conventional 28 nm process node technology has a CPP of 130 nm or greater and a metal-1 pitch that is greater than 90 nm. Because the second pitch 242 is less than 64 nm, as compared to being greater than 90 nm, the integrated circuit 200 may have a reduced dimension in the first direction (e.g., the vertical direction in FIG. 2). The reduced area (due to the reduced metal-1 pitch) of the integrated circuit 200 may enable a higher number of integrated circuits 200 to be integrated on a single semiconductor die than a number of integrated circuits formed using the conventional 28 nm process node technology, thus increasing density. Additionally, because metal lines of the higher metal layers above the metal-1 layer (e.g., the metal-2 layer and higher) are formed using a single patterning process instead of a double patterning process, a cost of the integrated circuit 200 may be reduced as compared to an integrated circuit formed using the conventional 16 nm or 14 nm process node technology. Thus, the integrated circuit 100 may provide improvements to area usage/ circuit density as compared to use of conventional 28 nm process node technology, and at lower complexity and cost than use of conventional 16 nm or 14 nm process node technology.

Figure 3:
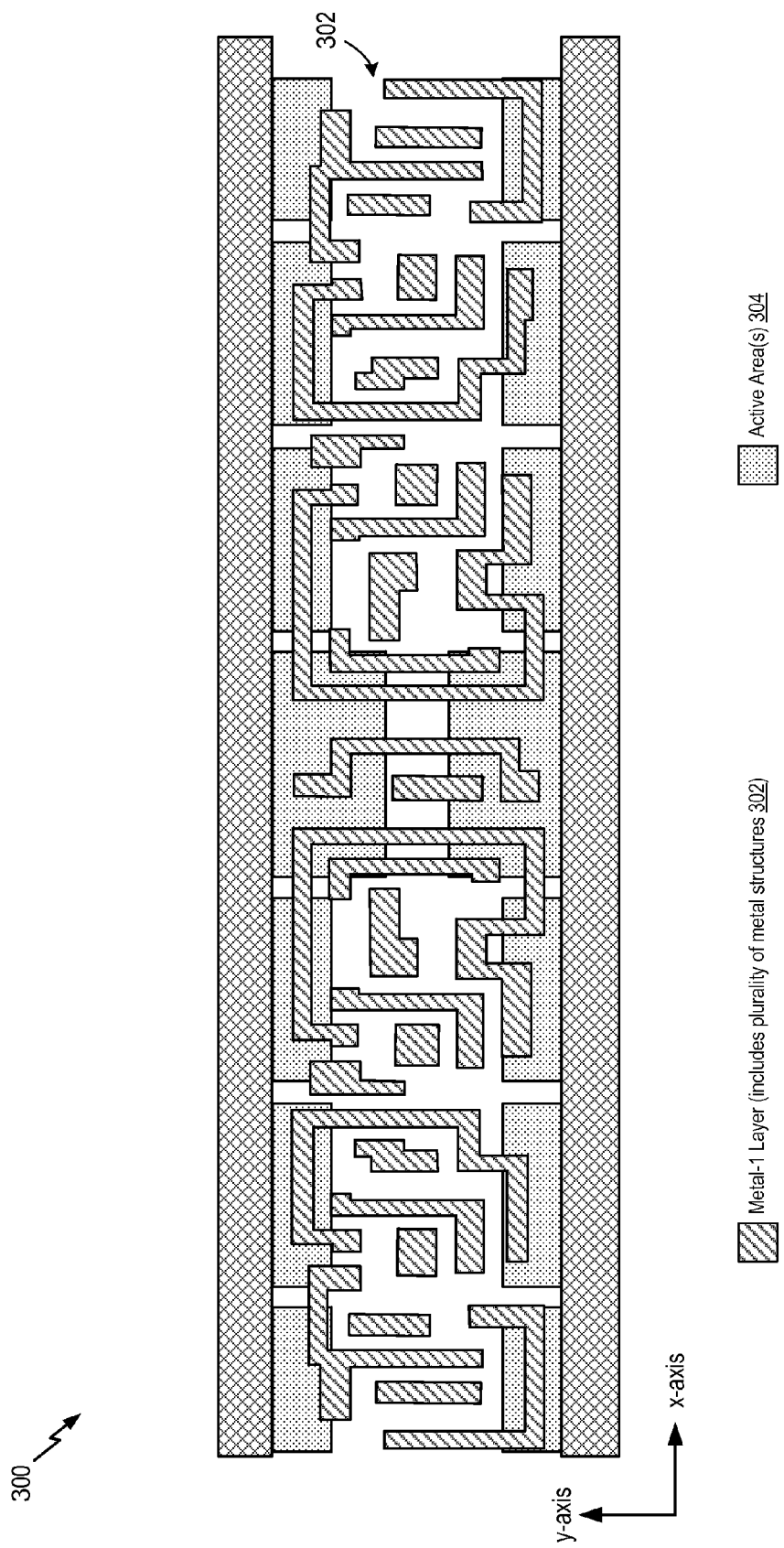
FIG. 3 illustrates a top down view of an integrated circuit including metal-1 lines having a two-dimensional routing arrangement.

Referring to FIG. 3, a top down view of an integrated circuit 300 including metal-1 lines having a two-dimensional routing arrangement is depicted. In a particular implementation, the integrated circuit 300 may include or correspond to the integrated circuit 100 of FIG. 1.

The integrated circuit 300 includes a plurality of metal lines 302 in a metal-1 layer. The plurality of metal lines 302 are disposed above a substrate that includes active areas 304. The active areas 304 may include source regions and/or drain regions of transistors. Other components of the integrated circuit 300, such as contact structures, gate structures, via structures, and higher metal lines are not illustrated for convenience.

As illustrated in FIG. 3, one or more metal lines of the plurality of metal lines 302 have a two-dimensional routing arrangement. For example, one or more metal lines of the plurality of metal lines 302 have a first portion that is routed in a first direction (e.g., a direction of the y-axis) and a second portion that is routed in a second direction (e.g., a direction of the x-axis). As explained with reference to FIG. 1, the first direction may be parallel to an axis along which a gate structure is oriented (e.g., the axis 270 of FIG. 2), and the second direction may be perpendicular to axis. In a particular implementation illustrated in FIG. 3, the first direction is a vertical direction and the second direction is a horizontal direction. In implementations where the integrated circuit 300 has a different orientation, the first direction and the second direction may not be the vertical direction and the horizontal direction, respectively.

Because one or more of the plurality of metal lines 302 have a two-dimensional routing arrangement, the plurality of metal lines 302 may have a metal-1 pitch that is greater than a CPP of the integrated circuit 300. For example, the two-dimensional routing arrangement may enable a metal line to couple together two contact structures on a lower level (e.g., a metal-0 level) that would otherwise be coupled by two metal lines having a metal-1 pitch approximately equal to the CPP. In a particular implementation, the metal-1 pitch may be approximately 90 nm and the CPP may be between approximately 80 nm and 100 nm. Because the metal-1 pitch of the plurality of metal lines 302 is approximately 90 nm, the plurality of metal lines 302 may be formed using a single patterning process, which may reduce a cost and complexity of fabricating the integrated circuit 300 as compared to an integrated circuit formed using the conventional 16 nm or 14 nm process node technology.

Figure 4:
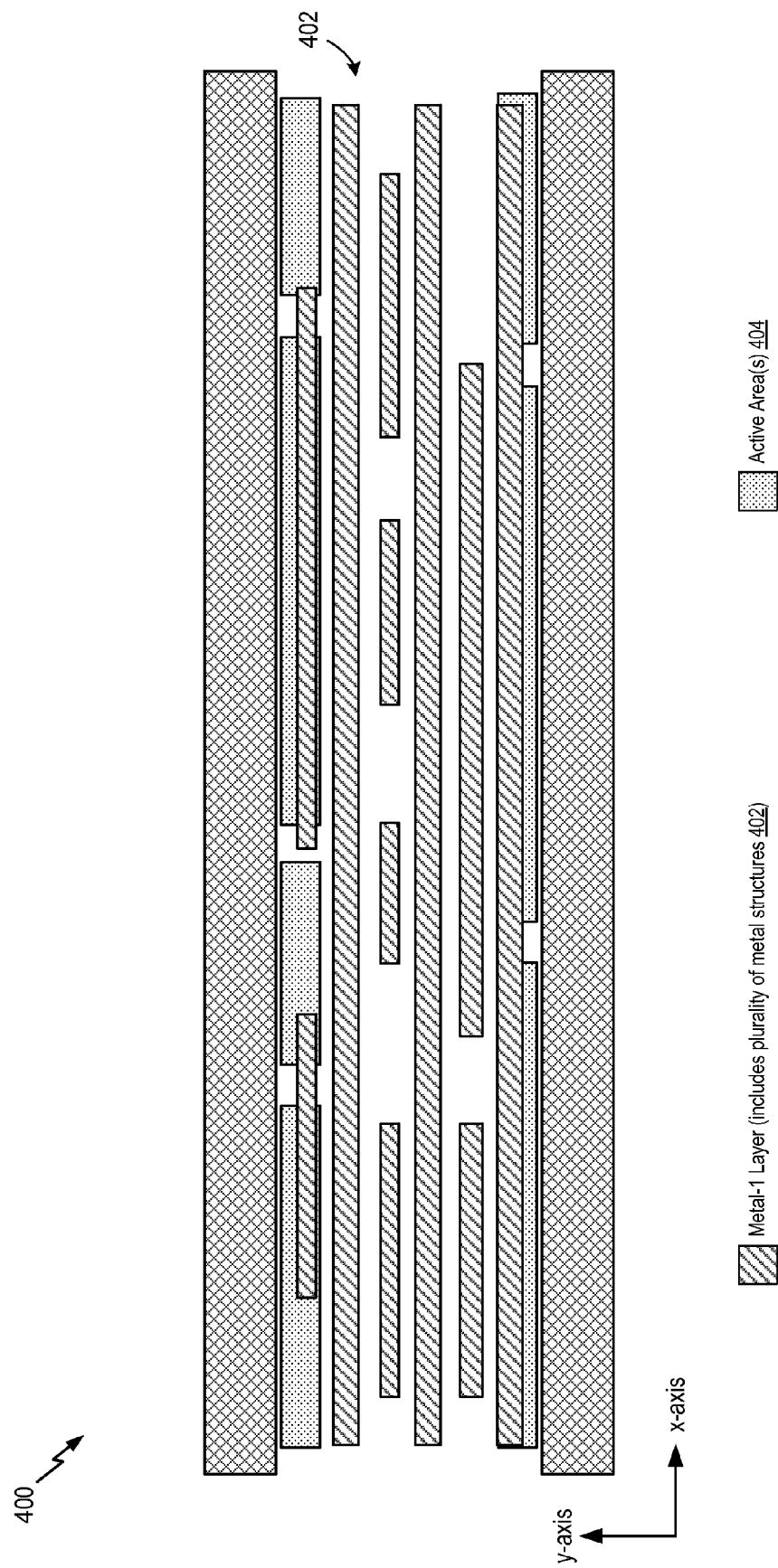
FIG. 4 illustrates a top down view of an integrated circuit that includes metal-1 lines having a reduced metal-1 pitch and a one-dimensional routing arrangement.

Referring to FIG. 4, a top down view of an integrated circuit 400 that includes metal-1 lines having a reduced metal-1 pitch and a one-dimensional routing arrangement is depicted. In a particular implementation, the integrated circuit 400 may include or correspond to the integrated circuit 200 of FIG. 2.

The integrated circuit 400 includes a plurality of metal lines 402 in a metal-1 layer. The plurality of metal lines 402 are disposed above a substrate that includes active areas 404. The active areas 404 may include source regions and/or drain regions of transistors. Other components of the integrated circuit 400, such as contact structures, gate structures, via structures, and higher metal lines are not illustrated for convenience.

As illustrated in FIG. 4, each of the plurality of metal lines 402 has a one-dimensional routing arrangement. For example, each of the plurality of metal lines 402 may be routed in a second direction (e.g., a direction of the x-axis) that is perpendicular to a first direction (e.g., a direction of the y-axis). As explained with reference to FIG. 2, the first direction may be parallel to an axis along which a gate structure is oriented (e.g., the axis 270 of FIG. 2), and the second direction may be perpendicular to the axis. In a particular implementation illustrated in FIG. 4, the first direction is a vertical direction and the second direction is a horizontal direction. In implementations where the integrated circuit 400 has a different orientation, the first direction and the second direction may not be the vertical direction and the horizontal direction, respectively.

The plurality of metal lines 402 has a reduced metal-1 pitch as compared to an integrated circuit formed using the conventional 28 nm process node technology. For example, the plurality of metal lines 402 has a metal-1 pitch that is less than approximately 64 nm, as compared to a metal-1 pitch value of greater than 90 nm in an integrated circuit formed using the conventional 28 nm process node technology. Because the metal-1 pitch of the plurality of metal lines 402 is less than approximately 90 nm, the plurality of metal lines 402 are formed using a double patterning process. However, as explained with reference to FIG. 2, via structures are located at alternating metal lines, thus enabling a via pitch of approximately 90 nm. Because the via pitch is approximately 90 nm, the via structures of the via-0 layer (e.g., the via structures coupling the plurality of metal lines 402 to structures in the metal-0 layer) may be formed using a single patterning process, which reduces complexity and cost as compared to forming the via structures using a double patterning process. Additionally, metal lines of higher metal layers (e.g., metal-2, metal-3, etc.) of the integrated circuit 400 may be formed using a single patterning process, as described with reference to FIG. 2. Thus, the integrated circuit 400 may be formed at a reduced cost and reduced complexity as compared to an integrated circuit formed using the conventional 16 nm or 14 nm process node technology.

Figure 5:
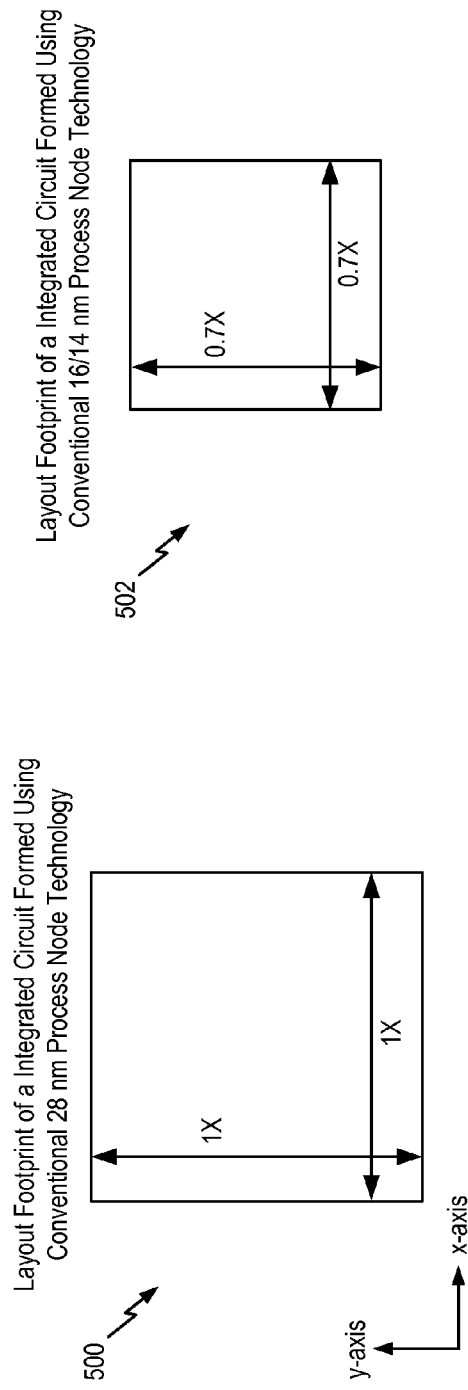
FIG. 5 illustrates integrated circuit cells including the integrated circuit 100 of FIG. 1, the integrated circuit 200 of FIG. 2, and integrated circuits formed using other process node technologies.
Figure 5:
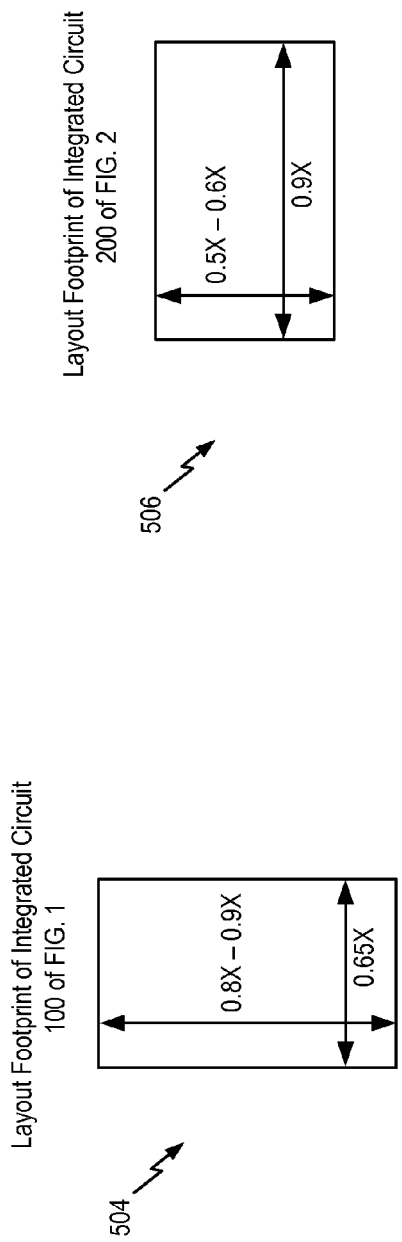

Referring to FIG. 5, integrated circuit cells including conventional integrated circuits, the integrated circuit 100 of FIG. 1, and the integrated circuit 200 of FIG. 2 are depicted. The cells may be formed on an area of a semiconductor die. Additionally, the cells may correspond to cells in a design library associated with a corresponding integrated circuit fabrication method or technology and may have one or more design rules or design constraints.

A first cell 500 includes a first integrated circuit formed using the conventional 28 nm process node technology. The first integrated circuit may have a CPP of 130 nm or greater and a metal-1 pitch that is greater than 90 nm. As illustrated in FIG. 5, the first cell 500 may have a symmetric aspect ratio. For example, a dimension in a first direction of a y-axis (e.g., a vertical direction in FIG. 5) may be the same as a dimension in a second direction of an x-axis (e.g., a horizontal direction in FIG. 5). A second cell 502 includes a second integrated circuit formed using the conventional 16 nm or 14 nm process node technology. The second integrated circuit may have a CPP of 90 nm or greater and a metal-1 pitch that is greater than 64 nm. As illustrated in FIG. 5, the second cell 502 may have a symmetric aspect ratio. For example, a dimension in a first direction of a y-axis (e.g., a vertical direction in FIG. 5) may be the same as a dimension in a second direction of an x-axis (e.g., a horizontal direction in FIG. 5). The dimensions of the second cell 502 may each be approximately 70% of the corresponding dimensions of the first cell 500.

A third cell 504 includes the integrated circuit 100 of FIG. 1. As explained with reference to FIG. 1, the integrated circuit 100 may have a CPP (e.g., the first pitch 140) that is greater than or equal to approximately 80 nm and less than approximately 100 nm and a metal-1 pitch (e.g., the second pitch 142) that is approximately 90 nm. As illustrated in FIG. 5, the third cell 504 may have an asymmetric aspect ratio. For example, a first dimension in a first direction (e.g., a direction of the y-axis) of the third cell 504 may substantially exceed a second dimension in a second direction (e.g., a direction of the x-axis) of the third cell 504. A first gate structure (e.g., the first gate structure 108 of FIG. 1) may be oriented along an axis (e.g., the axis 170) in the first direction and perpendicular to the second direction. The first dimension in the first direction may be between 80% to 90% of the corresponding dimension of the first cell 500, and the second dimension in the second direction may be 65% of the corresponding dimension of the first cell 500. Thus, the third cell 504 may have a smaller area than the first cell 500, which may increase a number of integrated circuits that include the third cell 504 (e.g., the integrated circuit 100 of FIG. 1) that may be included on a single semiconductor die, as compared to integrated circuits that include the first cell 500. Additionally, the third cell 504 (e.g., the integrated circuit 100 of FIG. 1) may be fabricated at reduced cost and reduced complexity as compared to the second cell 502, as described with reference to FIG. 1.

A fourth cell 506 includes the integrated circuit 200 of FIG. 2. As explained with reference to FIG. 2, the integrated circuit 200 may have a CPP (e.g., the first pitch 240) that is between approximately 100 nm and approximately 120 nm and a metal-1 pitch (e.g., the second pitch 242) that is less than approximately 64 nm. In a particular implementation, the metal-1 pitch (e.g., the second pitch 242) is within a range between approximately 48 nm and approximately 52 nm. As illustrated in FIG. 5, the fourth cell 506 may have an asymmetric aspect ratio. For example, a second dimension in a second direction (e.g., a direction of the x-axis) of the fourth cell 506 may substantially exceed a first dimension in a first direction (e.g., a direction of the y-axis) of the fourth cell 506. A first gate structure (e.g., the first gate structure 208 of FIG. 2) may be oriented along an axis (e.g., the axis 270) in the first direction and perpendicular to the second direction. The first dimension in the first direction may be between 50% to 60% of the corresponding dimension of the first cell 500, and the second dimension in the second direction may be 90% of the corresponding dimension of the first cell 500. Thus, the fourth cell 506 may have a smaller area than the first cell 500, which may increase a number of integrated circuits that include the fourth cell 506 (e.g., the integrated circuit 200 of FIG. 2) that may be included on a single semiconductor die, as compared to integrated circuits that include the first cell 500. Additionally, the fourth cell 506 (e.g., the integrated circuit 200 of FIG. 2) may be fabricated at reduced cost and reduced complexity as compared to the second cell 502, as described with reference to FIG. 2.

Figure 6:
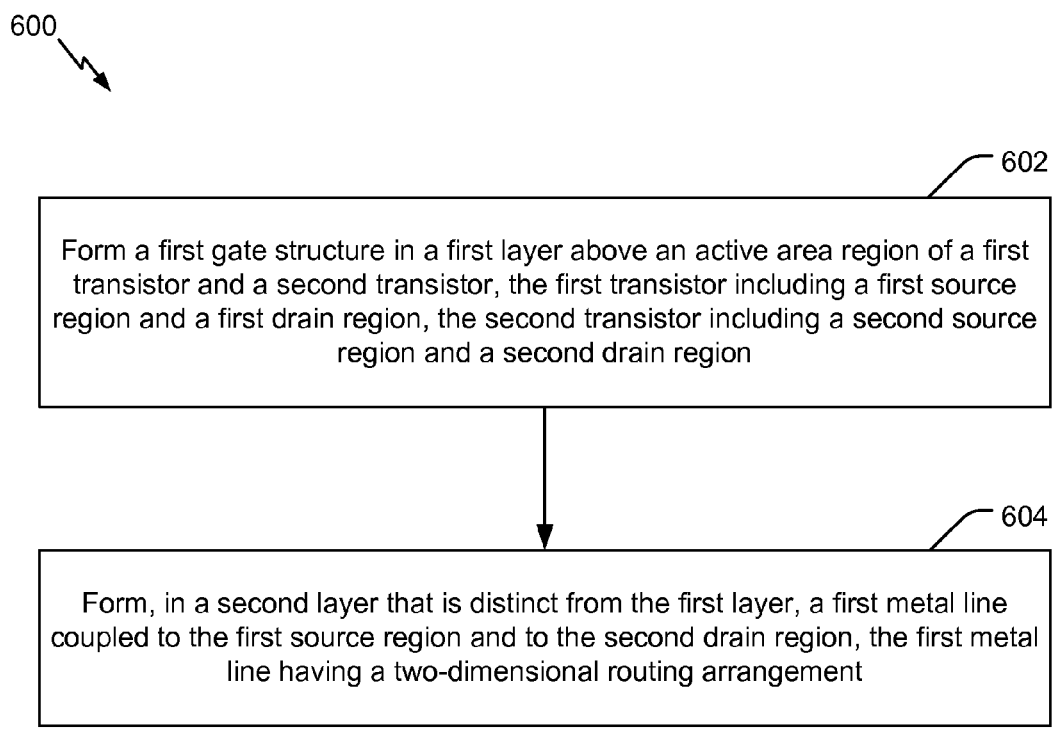
FIG. 6 is a flow chart that illustrates a method of fabricating an integrated circuit having a reduced contacted poly pitch and including metal line(s) in a metal-1 layer having a two-dimensional routing arrangement.

Referring to FIG. 6, a flow chart of an illustrative aspect of a method 600 of fabricating an integrated circuit is depicted. The integrated circuit has a reduced contacted poly pitch and includes metal line(s) in a metal-1 layer having a two-dimensional routing arrangement. For example, the integrated circuit may include or correspond to the integrated circuit 100 of FIG. 1.

The method 600 of fabricating the integrated circuit includes forming a first gate structure in a first layer above an active area layer of a first transistor and a second transistor, at 602. The first transistor may include a first source region and a first drain region, and the second transistor may include a second source region and a second drain region. For example, with reference to FIG. 1, the first gate structure 108 may be formed above a layer that includes active areas (e.g., the first source region 104, the first drain region 106, the second source region 114, and the second drain region 112) of the first transistor 102 and the second transistor 110. The first gate structure 108 may be formed in the metal-0 layer (e.g., the first layer) of the integrated circuit 100. In a particular implementation, the first transistor and the second transistor include FinFET devices. Additionally or alternatively, the first gate structure 108 is formed using a HK/MG last process.

The method 600 further includes forming, in a second layer that is distinct from the first layer, a first metal line coupled to the first source region and to the second drain region, at 604. The first metal line may have a two-dimensional routing arrangement. For example, with reference to FIG. 1, forming the integrated circuit 100 includes forming the first metal line 130 coupled to the first source region 104 and the second drain region 112. The first metal line 130 may have a two-dimensional routing arrangement. For example, a first portion 150 of the first metal line 130 may be routed in a first direction (e.g., a direction of the y-axis in FIG. 1) that is substantially parallel to the axis 170 of the first gate structure 108, and a second portion 152 of the first metal line 130 is routed in a second direction (e.g., a direction of the x-axis in FIG. 1) substantially perpendicular to the axis 170. Additional two-dimensional routing arrangements of metal lines are illustrated in FIG. 3.

In a particular implementation, the method 600 includes forming a second gate structure and forming a second metal line adjacent to the first metal line. A first pitch between the first gate structure and the second gate structure may be greater than or equal to approximately 80 nm and less than approximately 100 nm, and a second pitch between the first metal line and the second metal line may be approximately 90 nm. For example, with reference to FIG. 1, the first pitch 140 between the first gate structure 108 and the second gate structure 134 may be greater than or equal to approximately 80 nm and less than approximately 100 nm, and the second pitch 142 between the first metal line 130 and the second metal line 132 may be approximately 90 nm. Because the first pitch 140 (e.g., the CPP) is greater than or equal to approximately 80 nm and less than approximately 90 nm, the integrated circuit 100 has a reduced CPP as compared to an integrated circuit formed using the conventional 28 nm process node technology, which has a CPP of 130 nm.

In a particular implementation, the method 600 includes forming a first contact structure coupled to the first source region, forming a second contact structure coupled to the second drain region, and forming a third contact structure coupled to the first gate structure. The first contact structure, the second contact structure, and the third contact structure may be formed during a middle of line (MOL) fabrication stage. For example, the method 600 may include forming the first contact structure 116 coupled to the first source region 104, forming the second contact structure 118 coupled to the second drain region 112, and forming the third contact structure 128 coupled to the first gate structure 108. The first contact structure 116, the second contact structure 118, and the third contact structure 128 may be formed during a MOL fabrication stage of the integrated circuit 100.

In a particular implementation, the method 600 includes forming a plurality of metal lines in the second layer using a single patterning process. The plurality of metal lines may include the first metal line. For example, metal lines (e.g., the first metal line 130 and the second metal line 132) of the metal-1 layer may be formed using a single patterning process because the metal-1 pitch (e.g., the second pitch 142) is greater than or equal to approximately 90 nm. Additionally or alternatively, the method 600 may include forming, in a third layer that is distinct from the second layer, a second plurality of metal lines using a single patterning process. For example, a plurality of metal lines (including the third metal line 160) may be formed in higher metal layers (e.g., the metal-2 layer, the metal-3 layer, etc.) using a single patterning process. Forming metal lines in the metal-1 layer and higher metal layers may reduce cost and complexity of the method 600, as compared to the conventional 16 nm or 14 nm process node technology, which includes forming metal lines in each metal layer using a double patterning process. Additionally, a number of masks used during the method 600 may be reduced as compared to the conventional 16 nm or 14 nm process node technology. In a particular implementation, the method 600 may be performed using between 9 and 11 fewer masks than the conventional 16 nm or 14 nm process node technology. Using less masks may further reduce the complexity of the method 600 as compared to the conventional 16 nm or 14 nm process node technology.

In a particular implementation, the first transistor and the second transistor (e.g., the integrated circuit) are included in a cell. The first gate structure may be oriented along an axis in a first direction, and a first dimension of the cell in the first direction may substantially exceed a second dimension of the cell in a second direction that is perpendicular to the first direction. For example, the third cell 504 of FIG. 5 has a first dimension (in a direction of the y-axis in FIG. 5) that substantially exceeds a second dimension (in a direction of the x-axis in FIG. 5). The first gate structure 108 may be oriented along the axis 170 in the first direction (e.g., the direction of the y-axis).

The method 600 may form an integrated circuit having reduced dimensions (e.g., a CPP) as compared to an integrated circuit formed using the conventional 28 nm process node technology. Additionally, the method 600 has reduced cost and reduced complexity as compared to the conventional 16 nm or 14 nm process node technology because metal lines of each metal layer are formed using a single patterning process.

Figure 7:
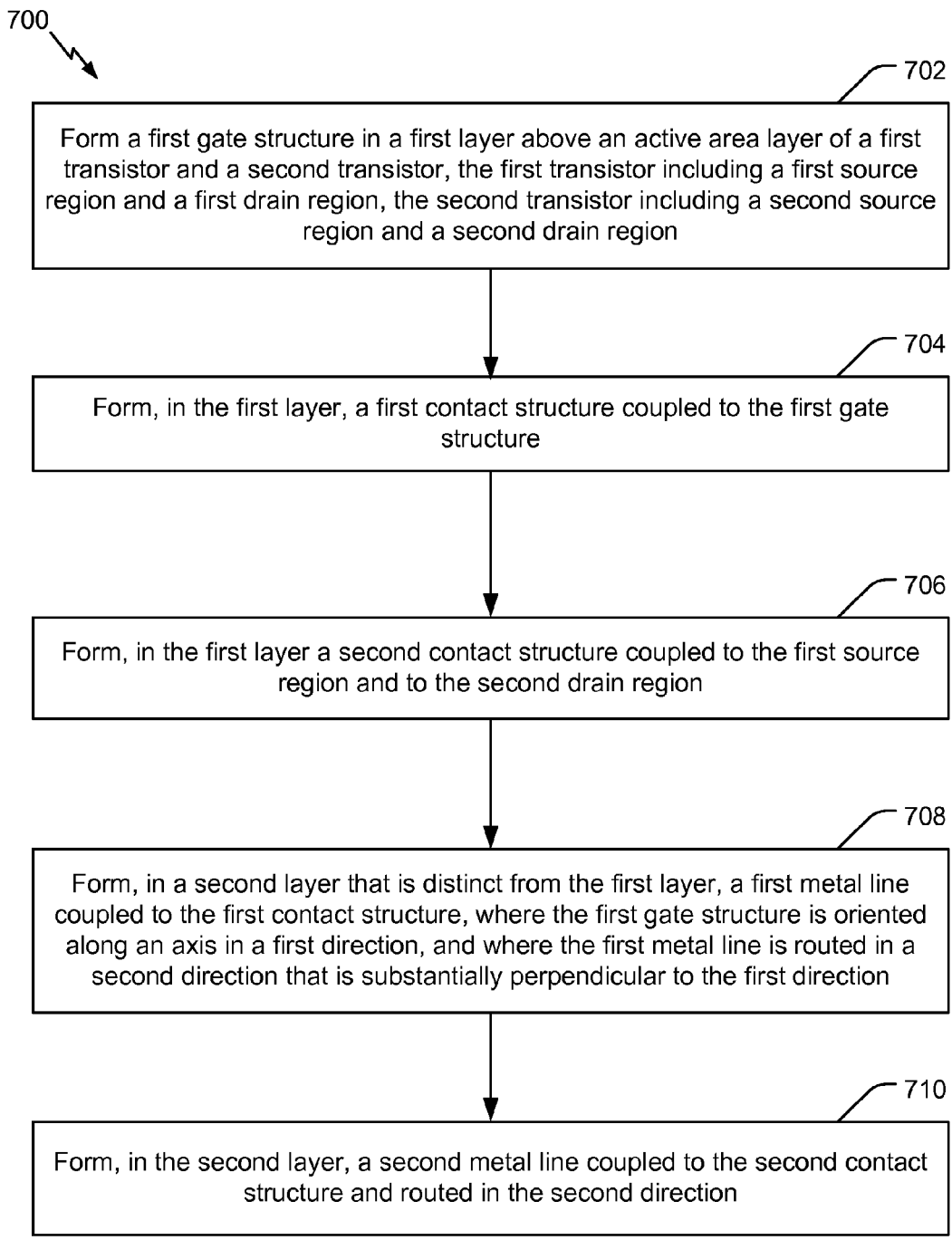
FIG. 7 is a flow chart that illustrates a method of fabricating an integrated circuit having a gate structure and a contact structure in a metal-0 layer and a metal-1 layer having a reduced metal-1 pitch and a one-dimensional routing arrangement.

Referring to FIG. 7, a flow chart of an illustrative aspect of a method 700 of fabricating an integrated circuit is depicted. The integrated circuit has a gate structure and a contact structure in a metal-0 layer and has a metal-1 layer having a reduced metal-1 pitch and a one-dimensional routing arrangement. For example, the integrated circuit may include or correspond to the integrated circuit 200 of FIG. 2.

The method 700 of fabricating the integrated circuit includes forming a first gate structure in a first layer above an active area layer of first transistor and a second transistor, at 702. The first transistor include a first source region and a first drain region, and the second transistor include a second source region and a second drain region. For example, with reference to FIG. 2, the first gate structure 208 may be formed above a layer that includes active areas (e.g., the first source region 204, the first drain region 206, the second source region 214, and the second drain region 212) of the first transistor 202 and the second transistor 210. The first gate structure 208 may be formed in the metal-0 layer (e.g., the first layer) of the integrated circuit 200. In a particular implementation, the first transistor and the second transistor include FinFET devices. Additionally or alternatively, the first gate structure 208 is formed using a HK/MG last process.

The method 700 includes forming, in the first layer, a first contact structure coupled to the first gate structure, at 704. For example, the method 700 includes forming the first contact structure 216 coupled to the first gate structure 208. The first contact structure 216 may be formed in the metal-0 layer (e.g., the first layer). The method 700 includes forming, in the first layer, a second contact structure coupled to the first source region and to the second drain region, at 706.

For example, the method 700 includes forming the second contact structure 218 coupled to the first source region 204 and the second drain region 212. The second contact structure 218 may be formed in the metal-0 layer (e.g., the first layer).

The method 700 includes forming, in a second layer that is distinct from the first layer, a first metal line coupled to the first contact structure, at 708. The first gate structure may be oriented along an axis in a first direction, and the first metal line may be routed in a second direction that is substantially perpendicular to the first direction. For example, the method 700 includes forming the first metal line 230 coupled to the first contact structure 216. The first metal line 230 may be formed in the metal-1 layer (e.g., the second layer) and may be routed in the second direction (e.g., the horizontal direction) that is substantially perpendicular to the first direction (e.g., the vertical direction) of the axis 270 of the first gate structure 208. The first metal line 230 may have a one-dimensional routing arrangement, as illustrated with respect to FIG. 4.

The method 700 further includes forming, in the second layer, a second metal line coupled to the second contact structure and routed in the second direction, at 710. For example, the method 700 includes forming the second metal line 232 coupled to the second contact structure 218. The second metal line 232 may be formed in the metal-1 layer (e.g., the second layer) and may be routed in the second direction (e.g., the horizontal direction) that is substantially perpendicular to the first direction (e.g., the vertical direction) of the axis 270 of the first gate structure 208. The second metal line 232 may have a one-dimensional routing arrangement, as illustrated with respect to FIG. 4.

In a particular implementation, the method 700 includes forming a second gate structure and forming a third metal line between the first metal line and the second metal line. A first pitch between the first gate structure and the second gate structure may be between approximately 100 nm and approximately 120 nm, and a second pitch between the first metal line and the third metal line may be less than approximately 64 nm. For example, with reference to FIG. 2, the first pitch 240 between the first gate structure 208 and the second gate structure 224 may be between approximately 100 nm and approximately 120 nm, and the second pitch 242 between the first metal line 230 and the third metal line 234 may be less than approximately 64 nm. In a particular implementation, the second pitch 242 may be within a range between approximately 48 nm and approximately 52 nm. Because the second pitch 242 (e.g., the metal-1) is less than approximately 64 nm, the integrated circuit 200 has a reduced metal-1 pitch as compared to an integrated circuit formed using the conventional 28 nm process node technology, which has a CPP of 90 nm.

In a particular implementation, the method 700 includes forming a first via structure and a second via structure using a single patterning process. The first contact structure may be coupled to the first metal line by the first via structure, and the second contact structure may be coupled to the second metal line by the second via structure. For example, the method 700 may include forming the first via structure 220 and the second via structure 222 using a single patterning process. The first contact structure 216 may be coupled by a first via structure 220 to the first metal line 230, and the second contact structure 218 may be coupled by the second via structure 222 to the second metal line 232. Additionally, a via pitch between the first via structure and the third via structure is greater than or equal to approximately 90 nm. For example, the via pitch 244 may be greater than or equal to approximately 90 nm. To maintain the via pitch, via structures may be formed at alternating metal lines (e.g., if the first via structure 220 is formed at the first metal line 230, the second via structure 222 is formed at the second metal line 232 instead of at the third metal line 234 that is adjacent to the first metal line 230). Because the via pitch 244 is greater than or equal to approximately 90 nm, the first via structure 220 and the second via structure 222 may be formed using a single patterning process.

In a particular implementation, the method 700 includes forming a plurality of metal lines in the second layer using a double patterning process. The plurality of metal lines may include the first metal line and the second. For example, metal lines (e.g., the metal lines 230-236) of the metal-1 layer may be formed using a double patterning process due to the metal-1 pitch (e.g., the second pitch 242) being less than 90 nm. Additionally or alternatively, the method 700 may include forming, in a third layer that is distinct from the second layer, a second plurality of metal lines using a single patterning process. For example, a plurality of metal lines (including the fourth metal line 260) may be formed in higher metal layers (e.g., the metal-2 layer, the metal-3 layer, etc.) using a single patterning process. Forming metal lines in the higher metal layers may reduce cost and complexity of the method 700, as compared to the conventional 16 nm or 14 nm process node technology, which includes forming metal lines in each metal layer using a double patterning process. Additionally, a number of masks used during the method 700 may be reduced as compared to the conventional 16 nm or 14 nm process node technology. In a particular implementation, the method 700 may be performed using between 9 and 11 fewer masks than the conventional 16 nm or 14 nm process node technology. Using less masks may further reduce the complexity of the method 700 as compared to the conventional 16 nm or 14 nm process node technology.

In a particular implementation, the first transistor and the second transistor (e.g., the integrated circuit) are included in a cell. A second dimension of the cell in the second direction may substantially exceed a first dimension of the cell in the first direction. For example, the fourth cell 506 of FIG. 5 has a second dimension (in a direction of the x-axis in FIG. 5) that substantially exceeds a first dimension (in a direction of the y-axis in FIG. 5). The first gate structure 208 may be oriented along the axis 270 in the first direction (e.g., the direction of the y-axis).

The method 700 may form an integrated circuit having reduced dimensions (e.g., a metal-1 pitch) as compared to an integrated circuit formed using the conventional 28 nm process node technology. Additionally, the method 700 has reduced cost and reduced complexity as compared to the conventional 16 nm or 14 nm process node technology because only metal lines of the metal-1 layer are formed using a double patterning process.

The methods 600 of FIG. 6 and 700 of FIG. 7 may be implemented by a field-programmable gate array (FPGA) device, an application-specific integrated circuit (ASIC), a processing unit such as a central processing unit (CPU), a digital signal processor (DSP), a controller, another hardware device, a firmware device, or any combination thereof. As an example, the methods 600 of FIG. 6 and 700 of FIG. 7 may be performed by one or more processors that execute instructions stored at a memory, such as a non-transitory computer-readable medium. The one or more processors and the memory may be integrated within equipment of a semiconductor fabrication plant to perform a fabrication process, as described further with reference to FIG. 9.

Referring to FIG. 8, a block diagram of a particular illustrative implementation of a wireless communication device 800 is depicted. The device 800 may include an integrated circuit 864. The integrated circuit 864 may include or correspond to the integrated circuit 100 of FIG. 1 or the integrated circuit 200 of FIG. 2. Additionally, the integrated circuit 864 may be formed using the method 600 of FIG. 6 or the method 700 of FIG. 7.

The device 800 includes a processor 810, such as a digital signal processor (DSP), coupled to a memory 832. The processor 810 may include the integrated circuit 864 (e.g., the integrated circuit 100 of FIG. 1 or the integrated circuit 200 of FIG. 2). For example, the processor 810 may include a component, such as a logic gate, an adder, a cache, a register, or another component that includes or corresponds to the integrated circuit 864 (e.g., the integrated circuit 100 of FIG. 1 or the integrated circuit 200 of FIG. 2).

The memory 832 includes instructions 868 (e.g., executable instructions) such as computer-readable instructions or processor-readable instructions. The instructions 868 may include one or more instructions that are executable by a computer, such as the processor 810.

FIG. 8 also illustrates a display controller 826 that is coupled to the processor 810 and to a display 828. A coder/decoder (CODEC) 834 may also be coupled to the processor 810. A speaker 836 and a microphone 838 may be coupled to the CODEC 834.

FIG. 8 also illustrates that a wireless interface 840, such as a wireless controller, and a transceiver 846 may be coupled to the processor 810 and to an antenna 842, such that wireless data received via the antenna 842, the transceiver 846, and the wireless interface 840 may be provided to the processor 810. In some implementations, the processor 810, the display controller 826, the memory 832, the CODEC 834, the wireless interface 840, and the transceiver 846 are included in a system-in-package or system-on-chip device 822. In some implementations, an input device 830 and a power supply 844 are coupled to the system-on-chip device 822. Moreover, in a particular aspect, as illustrated in FIG. 8, the display 828, the input device 830, the speaker 836, the microphone 838, the antenna 842, and the power supply 844 are external to the system-on-chip device 822. However, each of the display 828, the input device 830, the speaker 836, the microphone 838, the antenna 842, and the power supply 844 may be coupled to a component of the system-on-chip device 822, such as an interface or a controller. Although the integrated circuit 864 (e.g., the integrated circuit 100 of FIG. 1 or the integrated circuit 200 of FIG. 2) is depicted as being included in the processor 810, the integrated circuit 864 may be included in another component of the device 800 or a component coupled to the device 800. For example, the integrated circuit 864 (e.g., the integrated circuit 100 of FIG. 1 or the integrated circuit 200 of FIG. 2) may be included in the wireless interface 840, the transceiver 846, the power supply 844, the input device 830, the display controller 826, or another component that includes integrated circuits.

In conjunction with the described aspects, a first apparatus includes means for coupling a first transistor to a second transistor. The first transistor may include a first source region and a first drain region, and the second transistor may include a second source region and a second drain region. The means for coupling may be included in a first layer. The means for coupling may include or correspond to the first gate structure 108 of FIG. 1, one or more other structures or circuits configured to couple a first transistor to a second transistor, or any combination thereof.

The first apparatus further includes means for conducting, the means for conducting coupled to the first source region and to the second drain region. The means for conducting may have a two-dimensional routing arrangement and may be included in a second layer that is distinct from the first layer. The means for conducting may include or correspond to the first metal line 130 of FIG. 1, one or more other structures or circuits configured to conduct current, or any combination thereof.

In conjunction with the described aspects, a second apparatus includes means for coupling a first transistor to a second transistor. The first transistor may include a first source region and a first drain region, and the second transistor may include a second source region and a second drain region. The means for coupling may include or correspond to the first gate structure 208 of FIG. 2, one or more other structures or circuits configured to couple a first transistor to a second transistor, or any combination thereof.

The second apparatus includes first means for conducting, the first means for conducting coupled to the means for coupling. The first means for conducting may include or correspond to the first contact structure 216 of FIG. 2, one or more other structures or circuits configured to conduct current, or any combination thereof.

The second apparatus includes second means for conducting, the second means for conducting coupled to the first source region and to the second drain region. The first means for conducting and the second means for conducting may be included in a first layer. The second means for conducting may include or correspond to the second contact structure 218 of FIG. 2, one or more other structures or circuits configured to conduct current, or any combination thereof.

The second apparatus includes third means for conducting, the third means for conducting coupled to the first means for conducting. The third means for conducting may include or correspond to the first metal line 230 of FIG. 2, one or more other structures or circuits configured to conduct current, or any combination thereof.

The second apparatus further includes fourth means for conducting, the fourth means for conducting coupled to the second means for conducting. The third means for conducting and the fourth means for conducting may be included in a second layer that is distinct from the first layer. The means for coupling the first transistor to the second transistor may be oriented along an axis in a first direction. The third means for conducting and the fourth means for conducting may be routed in a second direction that is substantially perpendicular to the first direction. The fourth means for conducting may include or correspond to the second metal line 232 of FIG. 2, one or more other structures or circuits configured to conduct current, or any combination thereof.

One or more of the disclosed aspects may be implemented in a system or an apparatus, such as the device 800, that may include a communications device, a personal digital assistant (PDA), a mobile phone, a cellular phone, a navigation device, a computer, a portable computer, a desktop computer, a set top box, an entertainment unit, a fixed location data unit, a mobile location data unit, a monitor, a computer monitor, a television, a tuner, a radio, a satellite radio, a music player, a digital music player, a portable music player, a video player, a digital video player, a digital video disc (DVD) player, a portable digital video player, or any other device that stores or retrieves data or computer instructions, or any combination thereof.

The foregoing disclosed devices and functionalities may be designed and configured into computer files (e.g. RTL, GDSII, GERBER, etc.) stored on computer readable media.

Some or all such files may be provided to fabrication handlers to fabricate devices based on such files. Resulting products include semiconductor wafers that are then cut into semiconductor dies and packaged into semiconductor chips. The semiconductor chips are then employed in devices described above. FIG. 9 depicts a particular illustrative implementation of an electronic device manufacturing process 900.

Physical device information 902 is received at the manufacturing process 900, such as at a research computer 906. The physical device information 902 may include design information representing at least one physical property of a semiconductor device, such as the integrated circuit 100 of FIG. 1 or the integrated circuit 200 of FIG. 2. For example, the physical device information 902 may include physical parameters, material characteristics, and structure information that is entered via a user interface 904 coupled to the research computer 906. The research computer 906 includes a processor 908, such as one or more processing cores, coupled to a computer readable medium (e.g., a non-transitory computer readable medium) such as a memory 910. The memory 910 may store computer readable instructions that are executable to cause the processor 908 to transform the physical device information 902 to comply with a file format and to generate a library file 912.

In a particular implementation, the library file 912 includes at least one data file including the transformed design information. For example, the library file 912 may include a library of semiconductor devices, such as the integrated circuit 100 of FIG. 1 or the integrated circuit 200 of FIG. 2 that is provided for use with an electronic design automation (EDA) tool 920.

The library file 912 may be used in conjunction with the EDA tool 920 at a design computer 914 including a processor 916, such as one or more processing cores, coupled to a memory 918. The EDA tool 920 may be stored as processor executable instructions at the memory 918 to enable a user of the design computer 914 to design a circuit including the integrated circuit 100 of FIG. 1 or the integrated circuit 200 of FIG. 2 of the library file 912. For example, a user of the design computer 914 may enter circuit design information 922 via a user interface 924 coupled to the design computer 914. The circuit design information 922 may include design information representing at least one physical property of a semiconductor device, such as the integrated circuit 100 of FIG. 1 or the integrated circuit 200 of FIG. 2. To illustrate, the circuit design property may include identification of particular circuits and relationships to other elements in a circuit design, positioning information, feature size information, interconnection information, or other information representing a physical property of a semiconductor device.

The design computer 914 may be configured to transform the design information, including the circuit design information 922, to comply with a file format. To illustrate, the file formation may include a database binary file format representing planar geometric shapes, text labels, and other information about a circuit layout in a hierarchical format, such as a Graphic Data System (GDSII) file format. The design computer 914 may be configured to generate a data file including the transformed design information, such as a GDSII file 926 that includes information describing the integrated circuit 100 of FIG. 1 or the integrated circuit 200 of FIG. 2, in addition to other circuits or information. To illustrate, the data file may include information corresponding to a system-on-chip (SOC) that includes the integrated circuit 100 of FIG. 1 or the integrated circuit 200 of FIG. 2 and that also includes additional electronic circuits and components within the SOC.

The GDSII file 926 may be received at a fabrication process 928 to manufacture the integrated circuit 100 of FIG. 1 or the integrated circuit 200 of FIG. 2, according to transformed information in the GDSII file 926. For example, a device manufacture process may include providing the GDSII file 926 to a mask manufacturer 930 to create one or more masks, such as masks to be used with photolithography processing, illustrated as a representative mask 932. The mask 932 may be used during the fabrication process 928 to generate one or more wafers 933, which may be tested and separated into dies, such as a representative die 936. The die 936 includes a circuit including the integrated circuit 100 of FIG. 1 or the integrated circuit 200 of FIG. 2.

For example, the fabrication process 928 may include a processor 934 and a memory 935 to initiate and/or control the fabrication process 928. The memory 935 may include executable instructions such as computer-readable instructions or processor-readable instructions. The executable instructions may include one or more instructions that are executable by a computer such as the processor 934.

The fabrication process 928 may be implemented by a fabrication system that is fully automated or partially automated. For example, the fabrication process 928 may be automated according to a schedule. The fabrication system may include fabrication equipment (e.g., processing tools) to perform one or more operations to form a semiconductor device. For example, deposit one or more materials, epitaxially grow one or more materials, conformally deposit one or more materials, apply a hardmask, apply an etching mask, perform etching, perform planarization, form a dummy gate stack, form a gate stack, deposit a conductive material, perform a chemical vapor deposition (CVD) process, perform a standard clean 1 type, or a combination thereof, as illustrative, non-limiting examples.

The fabrication system (e.g., an automated system that performs the fabrication process 928) may have a distributed architecture (e.g., a hierarchy). For example, the fabrication system may include one or more processors, such as the processor 934, one or more memories, such as the memory 935, and/or controllers that are distributed according to the distributed architecture. The distributed architecture may include a high-level processor that controls or initiates operations of one or more low-level systems. For example, a high-level portion of the fabrication process 928 may include one or more processors, such as the processor 934, and the low-level systems may each include or may be controlled by one or more corresponding controllers. A particular controller of a particular low-level system may receive one or more instructions (e.g., commands) from a high-level system, may issue sub-commands to subordinate modules or process tools, and may communicate status data back to the high-level system. Each of the one or more low-level systems may be associated with one or more corresponding pieces of fabrication equipment (e.g., processing tools). In a particular aspect, the fabrication system may include multiple processors that are distributed in the fabrication system. For example, a controller of a low-level system component of the fabrication system may include a processor, such as the processor 934.

Alternatively, the processor 934 may be a part of a high-level system, subsystem, or component of the fabrication system. In another aspect, the processor 934 includes distributed processing at various levels and components of a fabrication system.

Thus, the processor 934 may include processor-executable instructions that, when executed by the processor 934, cause the processor 934 to initiate or control formation of a semiconductor device. In a first particular aspect, the processor 934 may perform operations including initiating formation of a first gate structure in a first layer above an active area of a first transistor and a second transistor. The first transistor may include a first source region and a first drain region, and the second transistor may include a second source region and a second drain region. The operations may further include initiating formation, in a second layer that is distinct from the first layer, of a first metal line coupled to the first source region and to the second drain region. The first metal line may have a two-dimensional routing arrangement.

In a second particular aspect, the processor 934 may perform operations including initiating formation of a first gate structure in a first layer above an active area layer of a first transistor and above a second transistor. The first transistor may include a first source region and a first drain region, and the second transistor may include a second source region and a second drain region. The operations may include initiating formation, in the first layer, of a first contact structure coupled to the first gate structure. The operations may include initiating formation, in the first layer, of a second contact structure coupled to the first source region and to the second drain region. The operations may include initiating formation, in a second layer that is distinct from the first layer, of a first metal line coupled to the first contact structure. The first gate structure may be oriented along an axis in a first direction, and the first metal line may be routed in a second direction that is substantially perpendicular to the first direction. The operations may further include initiating formation, in the second layer, of a second metal line coupled to the second contact structure and routed in the second direction. One or more of the operations may be performed by controlling one of more deposition tools, such as a molecular beam epitaxial growth tool, a flowable chemical vapor deposition (FCVD) tool, a conformal deposition tool, or a spin-on deposition tool, one or more removal tools, such as a chemical removal tool, a reactive gas removal tool, a hydrogen reaction removal tool, or a standard clean 1 type removal tool, one or more etchers, such as a wet etcher, a dry etcher, or a plasma etcher, one or more dissolving tools, such as a developer or developing tool, one or more other tools, or a combination thereof.

The executable instructions included in the memory 935 may enable the processor 934 to initiate formation of a semiconductor device such as the integrated circuit 100 of FIG. 1 or the integrated circuit 200 of FIG. 2. In a particular implementation, the memory 935 is a non-transitory computer readable medium storing processor-executable instructions that are executable by the processor 934 to cause the processor 934 to perform the above-described operations.

The die 936 may be provided to a packaging process 938 where the die 936 is incorporated into a representative package 940. For example, the package 940 may include the single die 936 or multiple dies, such as a system-in-package (SiP) arrangement. The package 940 may be configured to conform to one or more standards or specifications, such as Joint Electron Device Engineering Council (JEDEC) standards.

Information regarding the package 940 may be distributed to various product designers, such as via a component library stored at a computer 946. The computer 946 may include a processor 948, such as one or more processing cores, coupled to a memory 950. A printed circuit board (PCB) tool may be stored as processor executable instructions at the memory 950 to process PCB design information 942 received from a user of the computer 946 via a user interface 944. The PCB design information 942 may include physical positioning information of a packaged semiconductor device on a circuit board, the packaged semiconductor device corresponding to the package 940 including the integrated circuit 100 of FIG. 1 or the integrated circuit 200 of FIG. 2.

The computer 946 may be configured to transform the PCB design information 942 to generate a data file, such as a GERBER file 952 with data that includes physical positioning information of a packaged semiconductor device on a circuit board, as well as layout of electrical connections such as traces and vias, where the packaged semiconductor device corresponds to the package 940 including the integrated circuit 100 of FIG. 1 or the integrated circuit 200 of FIG. 2. In other implementations, the data file generated by the transformed PCB design information 942 may have a format other than a GERBER format.

The GERBER file 952 may be received at a board assembly process 954 and used to create PCBs, such as a representative PCB 956, manufactured in accordance with the design information stored within the GERBER file 952. For example, the GERBER file 952 may be uploaded to one or more machines to perform various steps of a PCB production process. The PCB 956 may be populated with electronic components including the package 940 to form a representative printed circuit assembly (PCA) 958.

The PCA 958 may be received at a product manufacture process 960 and integrated into one or more electronic devices, such as a first representative electronic device 962 and a second representative electronic device 964. For example, the first representative electronic device 962, the second representative electronic device 964, or both, may include or correspond to the wireless communication device 800 of FIG. 8. As an illustrative, non-limiting example, the first representative electronic device 962, the second representative electronic device 964, or both, may include or correspond to a communications device, a fixed location data unit, a mobile location data unit, a mobile phone, a cellular phone, a satellite phone, a computer, a tablet, a portable computer, or a desktop computer. Alternatively or additionally, the first representative electronic device 962, the second representative electronic device 964, or both, may include a set top box, an entertainment unit, a navigation device, a personal digital assistant (PDA), a monitor, a computer monitor, a television, a tuner, a radio, a satellite radio, a music player, a digital music player, a portable music player, a video player, a digital video player, a digital video disc (DVD) player, a portable digital video player, any other device that stores or retrieves data or computer instructions, or a combination thereof, into which the integrated circuit 100 of FIG. 1 or the integrated circuit 200 of FIG. 2 is integrated. As another illustrative, non-limiting example, one or more of the electronic devices 962 and 964 may include remote units, such as mobile phones, hand-held personal communication systems (PCS) units, portable data units such as personal data assistants, global positioning system (GPS) enabled devices, navigation devices, fixed location data units such as meter reading equipment, or any other device that stores or retrieves data or computer instructions, or any combination thereof. Aspects of the disclosure may be suitably employed in any device which includes active integrated circuitry including memory and on-chip circuitry.

A device that includes the integrated circuit 100 of FIG. 1 or the integrated circuit 200 of FIG. 2 may be fabricated, processed, and incorporated into an electronic device, as described in the illustrative process 900. One or more aspects disclosed with respect to FIGS. 1-8 may be included at various processing stages, such as within the library file 912, the GDSII file 926, and the GERBER file 952, as well as stored at the memory 910 of the research computer 906, the memory 918 of the design computer 914, the memory 950 of the computer 946, the memory of one or more other computers or processors (not shown) used at the various stages, such as at the board assembly process 954, and also incorporated into one or more other physical implementations such as the mask 932, the die 936, the package 940, the PCA 958, other products such as prototype circuits or devices (not shown), or any combination thereof. Although various representative stages are depicted with reference to FIGS. 1-9, in other implementations fewer stages may be used or additional stages may be included. Similarly, the process 900 of FIG. 9 may be performed by a single entity or by one or more entities performing various stages of the process 900.

Although one or more of FIGS. 1-9 may illustrate systems, apparatuses, and/or methods according to the teachings of the disclosure, the disclosure is not limited to these illustrated systems, apparatuses, and/or methods. One or more functions or components of any of FIGS. 1-9 as illustrated or described herein may be combined with one or more other portions of another of FIGS. 1-9. Accordingly, no single implementation described herein should be construed as limiting and implementations of the disclosure may be suitably combined without departing form the teachings of the disclosure.

Those of skill would further appreciate that the various illustrative logical blocks, configurations, modules, circuits, and algorithm steps described in connection with the implementations disclosed herein may be implemented as electronic hardware, computer software executed by a processor, or combinations of both. Various illustrative components, blocks, configurations, modules, circuits, and steps have been described above generally in terms of their functionality. Whether such functionality is implemented as hardware or processor executable instructions depends upon the particular application and design constraints imposed on the overall system. Skilled artisans may implement the described functionality in varying ways for each particular application, but such implementation decisions should not be interpreted as causing a departure from the scope of the present disclosure.

The steps of a method or algorithm described in connection with the disclosure herein may be implemented directly in hardware, in a software module executed by a processor, or in a combination of the two. A software module may reside in random access memory (RAM), flash memory, read-only memory (ROM), programmable read-only memory (PROM), erasable programmable read-only memory (EPROM), electrically erasable programmable read-only memory (EEPROM), registers, hard disk, a removable disk, a compact disc read-only memory (CD-ROM), or any other form of non-transient storage medium known in the art. An exemplary storage medium is coupled to the processor such that the processor can read information from, and write information to, the storage medium. In the alternative, the storage medium may be integral to the processor. The processor and the storage medium may reside in an application-specific integrated circuit (ASIC). The ASIC may reside in a computing device or a user terminal. In the alternative, the processor and the storage medium may reside as discrete components in a computing device or user terminal.

The previous description is provided to enable a person skilled in the art to make or use the disclosed implementations. Various modifications to these implementations will be readily apparent to those skilled in the art, and the principles defined herein may be applied to other implementations without departing from the scope of the disclosure. Thus, the present disclosure is not intended to be limited to the implementations shown herein but is to be accorded the widest scope possible consistent with the principles and novel features as defined by the following claims.

What is claimed is:

1. An integrated circuit comprising:
   a first transistor including a first source region and a first drain region;
   a second transistor including a second source region and a second drain region;
   a first gate structure coupled to the first transistor and to the second transistor, wherein the first gate structure is included in a first layer;
   a second gate structure adjacent to the first gate structure, wherein the second gate structure is included in the first layer;
   a first metal line coupled to the first source region and to the second drain region, the first metal line having a two-dimensional routing arrangement, wherein the first metal line is included in a second layer that is distinct from the first layer; and
   a second metal line coupled to the first gate structure, wherein the second metal line is included in the second layer, and wherein a first pitch between the first gate structure and the second gate structure is less than a second pitch between the first metal line and the second metal line.

2. The integrated circuit of claim 1, wherein the first gate structure is oriented along an axis in a first direction, wherein a first portion of the first metal line is routed in the first direction, wherein a second portion of the first metal line is routed in a second direction substantially perpendicular to the first direction, wherein a first portion of the second metal line is routed in the first direction, and wherein a second portion of the second metal line is routed in a second direction substantially perpendicular to the first direction.

3. The integrated circuit of claim 2, wherein the first transistor and the second transistor comprise fin field-effect transistor (FinFET) devices, and wherein the axis corresponds to an x direction or to a y direction along a Cartesian coordinate system that corresponds to a surface of a substrate.

4. The integrated circuit of claim 1, further comprising a via structure coupled to the first metal line and a second via structure coupled to the second metal line.

5. The integrated circuit of claim 1, further comprising a first contact structure coupled to the first source region and coupled by a via structure to the first metal line and a second contact structure coupled to the first gate structure.

6. The integrated circuit of claim 1, wherein the first transistor and the second transistor are formed in a layer below the first gate structure, and further comprising a third metal line in contact with the first metal line, wherein the third metal line is in a third layer and the second layer is positioned between the third layer and the first layer.

7. The integrated circuit of claim 1, wherein the second pitch between the first metal line and the second metal line is approximately 90 nm.

8. The integrated circuit of claim 1, wherein the first transistor and the second transistor are formed in a layer below the first gate structure, and wherein the first transistor and the second transistor are included in a memory cell.

9. The integrated circuit of claim 1, wherein the first transistor and the second transistor are included in a mobile communication device.

10. The integrated circuit of claim 1, wherein a first pitch between the first gate structure and an adjacent gate structure is greater than approximately 80 nanometers (nm) and less than approximately 100 nm.

11. The integrated circuit of claim 1, wherein the first transistor, the second transistor, the first gate structure, the first metal line, and the second metal line are incorporated into a memory cell of a semiconductor die, and wherein the memory cell has an asymmetric aspect ratio.

12. The integrated circuit of claim 5, further comprising a second contact structure coupled to the second drain region and coupled by a second via structure to the first metal line, wherein the first contact structure and the second contact structure are included in the first layer.

13. The integrated circuit of claim 1, further comprising a third metal line coupled to the first metal line, wherein the third metal line is included in a third layer that is distinct from the first layer and that is distinct from the second layer.

14. The integrated circuit of claim 1, wherein the first source region and the second drain region are connected by the first metal line in the second layer.

15. The integrated circuit of claim 8, wherein a first dimension of the memory cell in the first direction exceeds a second dimension of the memory cell in a second direction that is perpendicular to the first direction.

16. The integrated circuit of claim 1, wherein the first transistor and the second transistor are included in a communications device, a personal digital assistant (PDA), a computer, a portable computer, a desktop computer, a set top box, an entertainment unit, a fixed location data unit, a monitor, a computer monitor, a television, a tuner, a radio, a satellite radio, a music player, a digital music player, a portable music player, a video player, a digital video player, a digital video disc (DVD) player, a portable digital video player, or any combination thereof.

* * * * *